United States Patent
Yu et al.

(10) Patent No.: US 8,248,903 B2
(45) Date of Patent: Aug. 21, 2012

(54) DECODING APPARATUS AND METHOD THEREOF

(75) Inventors: Chih-Ching Yu, Hsinchu (TW); Yu-Hsuan Lin, Taichung (TW)

(73) Assignee: Mediatek Inc., Hsin-Chu (TW)

(*) Notice: Subject to any disclaimer, the term of this patent is extended or adjusted under 35 U.S.C. 154(b) by 0 days.

(21) Appl. No.: 12/764,254

(22) Filed: Apr. 21, 2010

(65) Prior Publication Data

US 2011/0261668 A1 Oct. 27, 2011

(51) Int. Cl.
*G11B 20/10* (2006.01)
(52) U.S. Cl. .................... 369/59.22; 369/59.17
(58) Field of Classification Search ............ None
See application file for complete search history.

(56) References Cited

U.S. PATENT DOCUMENTS

| | | | |
|---|---|---|---|
| 5,148,287 A | 9/1992 | Kemmochi | |
| 6,198,420 B1 | 3/2001 | Ryan et al. | |
| 6,459,394 B1 | 10/2002 | Nadi et al. | |
| 6,625,235 B1* | 9/2003 | Coker et al. | 375/341 |
| 6,977,970 B2* | 12/2005 | Shim et al. | 375/317 |
| 7,082,056 B2 | 7/2006 | Chen | |
| 7,236,108 B2 | 6/2007 | Cheng | |
| 7,356,097 B2 | 4/2008 | Park et al. | |
| 2005/0180287 A1* | 8/2005 | Lee et al. | 369/59.15 |
| 2006/0193307 A1* | 8/2006 | Tomita | 370/350 |
| 2007/0121464 A1* | 5/2007 | He | 369/59.23 |
| 2009/0202023 A1* | 8/2009 | Park | 375/341 |

FOREIGN PATENT DOCUMENTS

CN 1574006 2/2005

* cited by examiner

*Primary Examiner* — Paul Huber
(74) *Attorney, Agent, or Firm* — Thomas|Kayden

(57) ABSTRACT

An apparatus for improving decoding accuracy of an equalized signal having a direct current (DC) level obtained from an optical disk is provided. A Viterbi decoder is configured to decode the equalized signal and output a Viterbi-decoded signal. A DC controller is configured to adjust the DC level of the equalized signal such that the equalized signal with the adjusted DC level is decoded.

8 Claims, 26 Drawing Sheets

DECODING APPARATUS AND METHOD THEREOF

BACKGROUND OF THE INVENTION

1. Field of the Invention

The invention relates generally to a Viterbi decoding apparatus and method thereof, and more particularly, to a Viterbi decoding apparatus with improved decoding ability and method thereof.

2. Description of the Related Art

FIG. 1 depicts a diagram of an optical disk system. In FIG. 1, the optical pickup unit 2 retrieves a radio frequency (RF) signal from an optical disk 1. The retrieved RF signal is sent to a signal processing unit 3 for further processing. The processed signal is provided to an analog-to-digital converter (ADC) 4 to be digitalized into a digital signal. The digital signal is sent to a phase loop lock (PLL) processing unit 5 and a finite impulse response (FIR) equalizer 6. The FIR equalizer 6 performs an equalization operation on the received signal and outputs an equalized signal to a Viterbi decoder 7 for data decoding. The Viterbi decoder 7 decodes the received signal and outputs a Viterbi-decoded signal (binary data). The binary data is decoded by a decoder 8 to output a decoded data.

Generally, modern optical disk systems have small channel bit lengths and track pitches, thus making data retrieval more difficult. In light of the problem, a Partial Response Maximum Likelihood (PRML) mechanism is applied in optical disk systems. However, performance of the optical disks applying the PRML mechanism is less than desired.

BRIEF SUMMARY OF THE INVENTION

An embodiment of the invention discloses an apparatus for improving decoding accuracy of an equalized signal having a direct current (DC) level obtained from an optical disk, comprising a Viterbi decoder and a DC controller. The Viterbi decoder is configured to decode the equalized signal and output a Viterbi-decoded signal. The DC controller is configured to adjust the DC level of the equalized signal such that the equalized signal with the adjusted DC level is decoded.

Another embodiment of the invention discloses an apparatus for improving decoding accuracy of an equalized signal obtained from an optical disk, comprising a Viterbi decoder and a DC controller. The Viterbi decoder is configured to decode the equalized signal according to at least one target level and output a Viterbi-decoded signal. The DC controller is configured to adjust one or more of the at least one target level such that the equalized signal is decoded according to the adjusted target level.

Another embodiment of the invention discloses an apparatus for improving decoding accuracy of an input signal having a direct current (DC) level obtained from an optical disk, comprising an equalizer and a DC controller. The equalizer is configured to equalize the input signal and output an equalized signal. The DC controller is configured to adjust the DC level of the input signal such that the input signal with the adjusted DC level is equalized.

Another embodiment of the invention discloses an apparatus for improving decoding accuracy of an input signal obtained from an optical disk, comprising an equalizer and a DC controller. The equalizer is configured to equalize the input signal according to at least one target level and output an equalizer signal. The DC controller is configured to adjust one or more of the at least one target level such that the input signal is equalized according to the adjusted target level.

BRIEF DESCRIPTION OF THE DRAWINGS

The invention can be more fully understood by reading the subsequent detailed description and examples with references made to the accompanying drawings, wherein:

FIG. 2A-1 depicts a diagram of a Viterbi decoding apparatus according to an embodiment of the invention;

FIG. 2A-2 depicts a flowchart of a decoding method according to an embodiment of the invention, which is performed in accordance with the decoding apparatus in FIG. 2A-1;

FIG. 2B-1 depicts a diagram of a Viterbi decoding apparatus according to an embodiment of the invention;

FIG. 2B-2 depicts a flowchart of a decoding method according to an embodiment of the invention, which is performed in accordance with the decoding apparatus in FIG. 2B-1;

FIG. 3A-1 depicts a diagram of a Viterbi decoding apparatus according to an embodiment of the invention;

FIG. 3A-2 depicts a flowchart of a decoding method according to an embodiment of the invention, which is performed in accordance with the decoding apparatus in FIG. 3A-1;

FIG. 3B-1 depicts a diagram of a Viterbi decoding apparatus according to an embodiment of the invention;

FIG. 3B-2 depicts a flowchart of a decoding method according to an embodiment of the invention, which is performed in accordance with the decoding apparatus in FIG. 3B-1;

FIG. 4A-1 depicts a diagram of a Viterbi decoding apparatus according to an embodiment of the invention;

FIG. 4A-2 depicts a flowchart of a decoding method according to an embodiment of the invention, which is performed in accordance with the decoding apparatus in FIG. 4A-1;

FIG. 4B-1 depicts a diagram of a Viterbi decoding apparatus according to an embodiment of the invention;

FIG. 4B-2 depicts a flowchart of a decoding method according to an embodiment of the invention, which is performed in accordance with the decoding apparatus in FIG. 4B-1;

FIG. 5A-1 depicts a diagram of a decoding apparatus according to an embodiment of the invention;

FIG. 5A-2 depicts a flowchart of a decoding method according to an embodiment of the invention, which is performed in accordance with the decoding apparatus in FIG. 5A-1;

FIG. 5B-1 depicts a diagram of a decoding apparatus according to an embodiment of the invention;

FIG. 5B-2 depicts a flowchart of a decoding method according to an embodiment of the invention, which is performed in accordance with the decoding apparatus in FIG. 5B-1;

FIG. 6A-1 depicts a diagram of a decoding apparatus according to an embodiment of the invention;

FIG. 6A-2 depicts a flowchart of a decoding method according to an embodiment of the invention, which is performed in accordance with the decoding apparatus in FIG. 6A-1;

FIG. 6B-1 depicts a diagram of a decoding apparatus according to an embodiment of the invention;

FIG. 6B-2 depicts a flowchart of a decoding method according to an embodiment of the invention, which is performed in accordance with the decoding apparatus in FIG. 6B-1;

FIG. 7A-1 depicts a diagram of a decoding apparatus according to an embodiment of the invention;

FIG. 7A-2 depicts a flowchart of a decoding method according to an embodiment of the invention, which is performed in accordance with the decoding apparatus in FIG. 7A-1;

FIG. 7B-1 depicts a diagram of a decoding apparatus according to an embodiment of the invention;

FIG. 7B-2 depicts a flowchart of a decoding method according to an embodiment of the invention, which is performed in accordance with the decoding apparatus in FIG. 7B-1.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
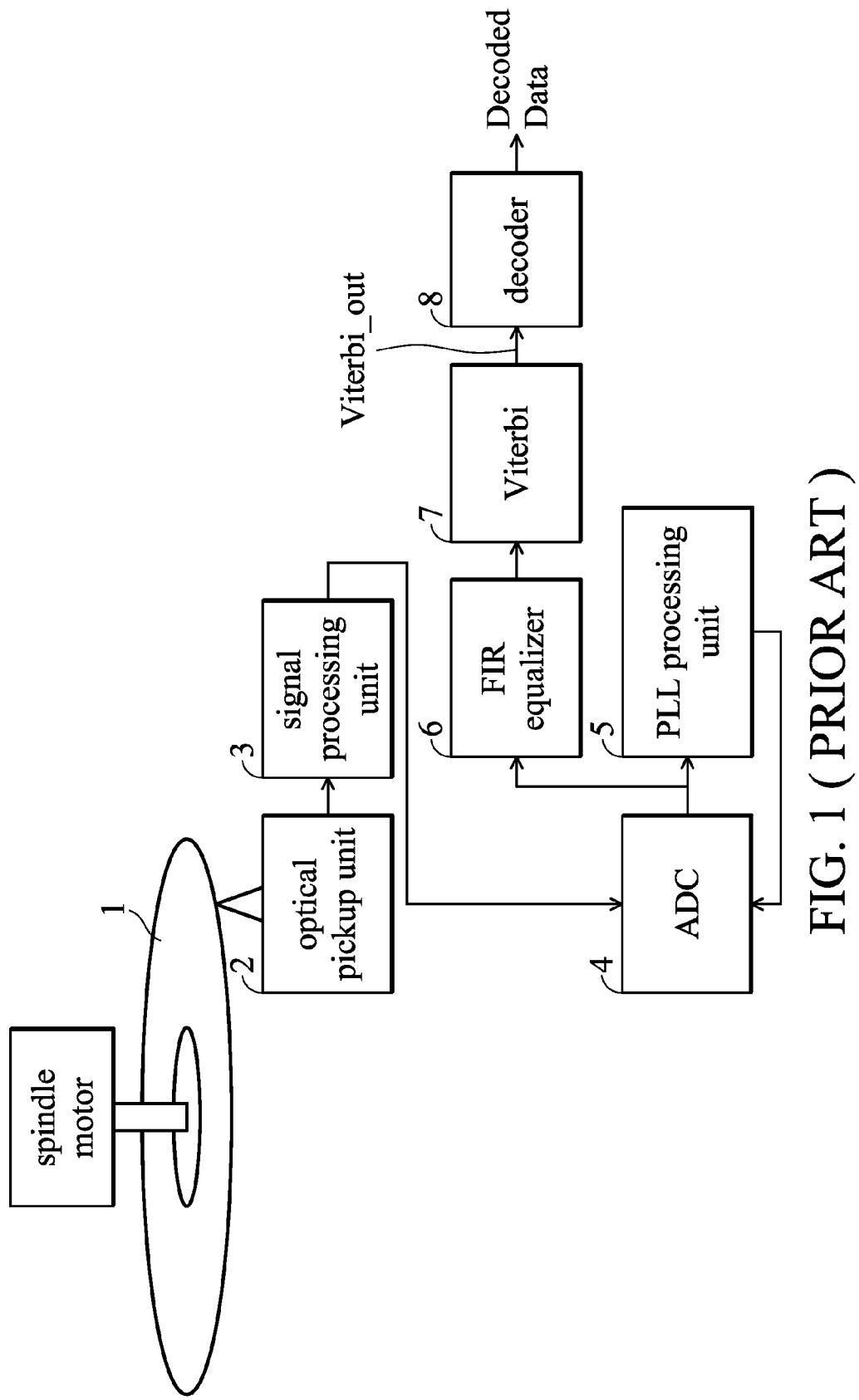
FIG. 1 depicts a diagram of an optical disk system.
Figures 1, 2A:
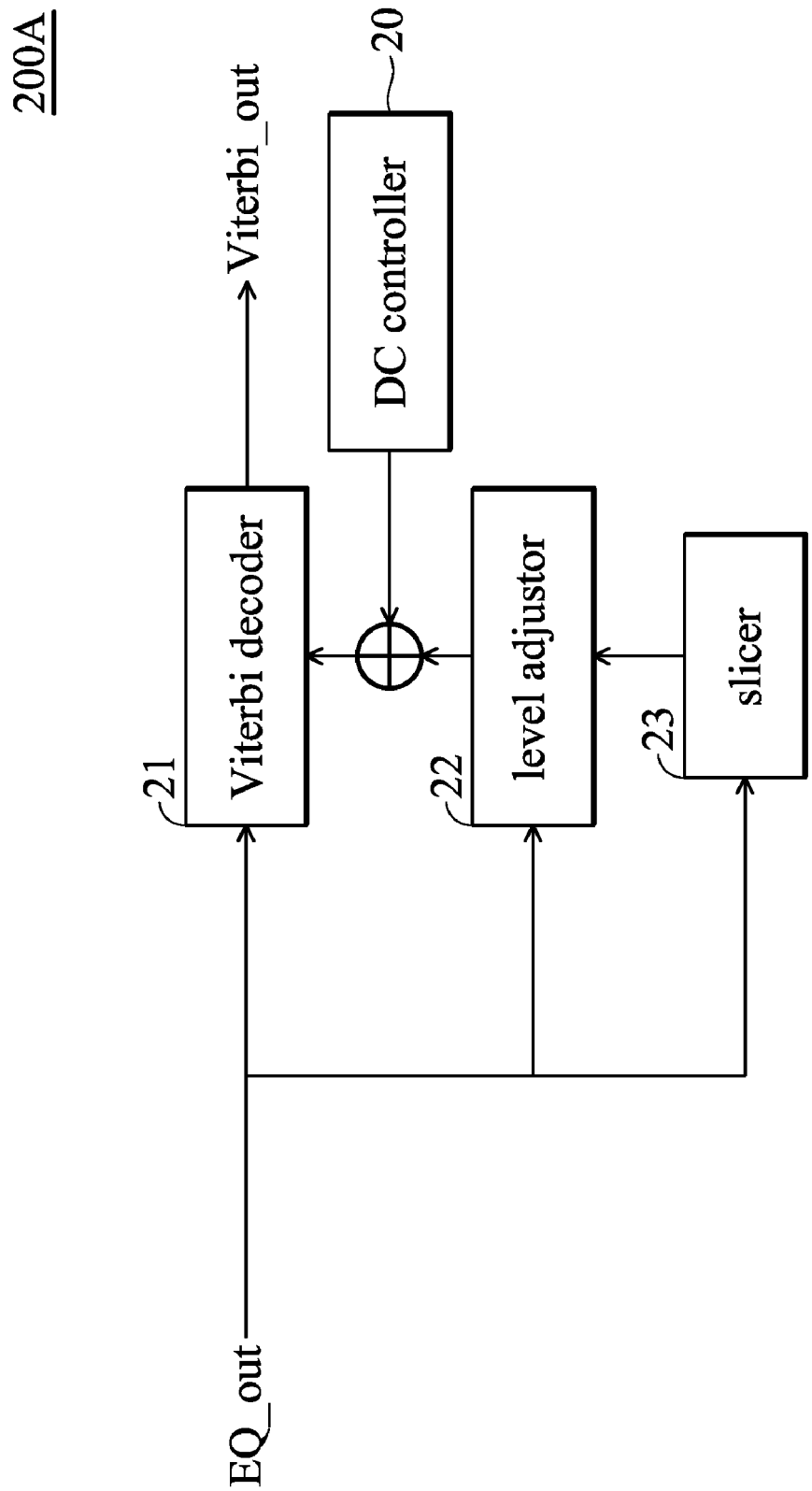
Figures 2, 2A:
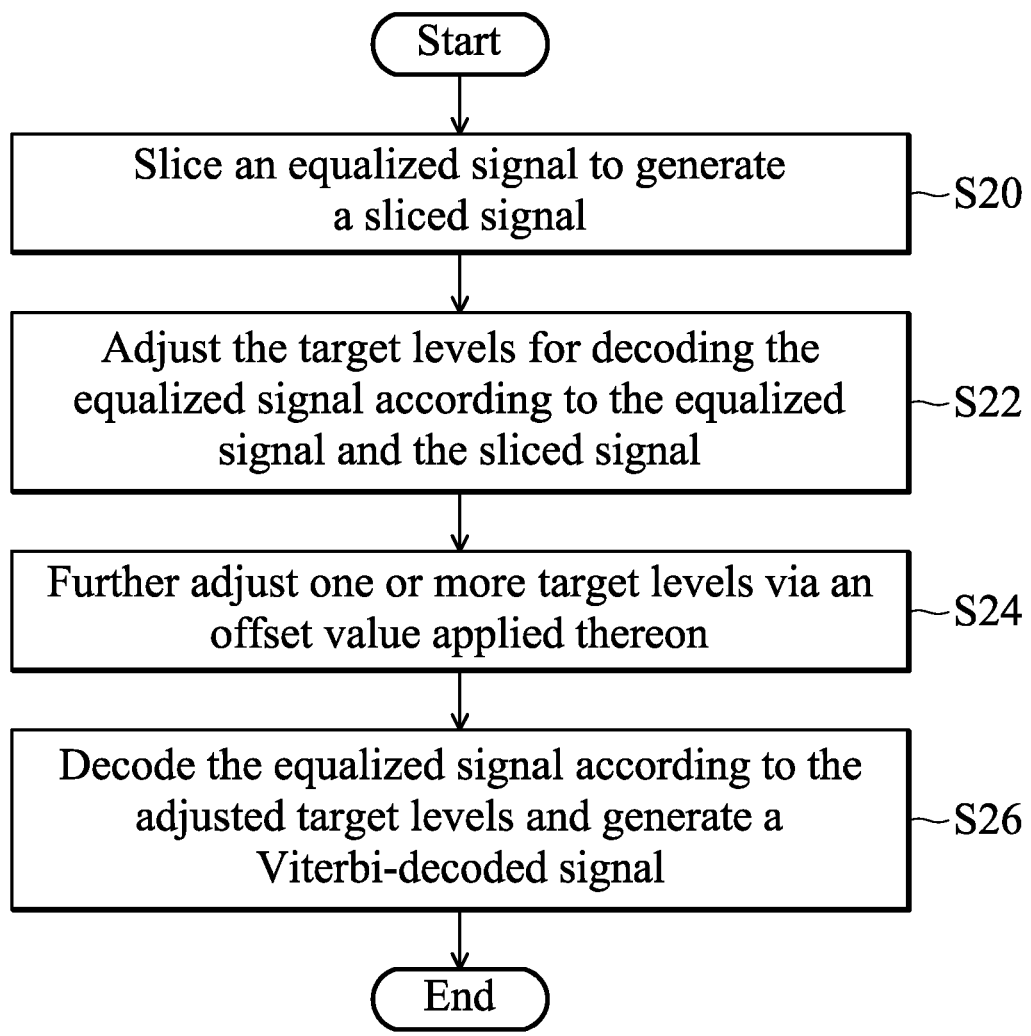

FIG. 2A-1 depicts a diagram of a Viterbi decoding apparatus according to an embodiment of the invention. The decoding apparatus 200A comprises a direct current controller (DC controller) 20, a Viterbi decoder 21, a level adjustor 22 and a slicer 23. In FIG. 2A-1, an equalized signal EQ_out is received by the decoding apparatus 200A. The slicer 23 slices the equalized signal EQ_out to generate a sliced signal. The level adjustor 22 adjusts at least one target level, which the decoding performed by the Viterbi decoder 21 is according to, according to the equalized signal EQ_out and the sliced signal. The Viterbi decoder 21 decodes the equalized signal EQ_out according to the adjusted target levels and generates a Viterbi-decoded signal Viterbi_out. During the decoding phase, the DC controller 20 may further adjust one or more target levels by applying an offset value thereon such that the Viterbi decoder 21 would decode the equalized signal EQ_out according to the further-adjusted target level(s). The offset value may be obtained by a table look-up method, or may be given by a user through a user interface. FIG. 2A-2 depicts a flowchart of a decoding method according to an embodiment of the invention, which is performed in accordance with the decoding apparatus in FIG. 2A-1. At the beginning, an equalized signal is sliced to generate a sliced signal (step S20). Next, the target levels for decoding the equalized signal can be adjusted according to the equalized signal and the sliced signal (step S22). One or more target levels can be further adjusted by applying an offset value thereon such that the equalized signal can be decoded according to the further-adjusted target level(s) (step S24). Next, the equalized signal is decoded according to the further-adjusted target levels (step S26). Note in the step S22, although it is stated that the target levels are adjusted according to the equalized signal and the sliced signal, the target levels may also be adjusted based on the Viterbi-decoded signal Viterbi_out, or based on the signals from earlier or later stages, such as the ADC 4 output signal. Besides, the order of performing the steps described above is not limited to the order shown in FIG. 2A-2.

As stated above that the level adjustor 22 adjusts the target levels for the Viterbi decoder 21 according to the equalized signal EQ_out and the sliced signal. The detailed procedures for adjusting the target levels will be described in FIG. 8.

Figures 1, 2B:
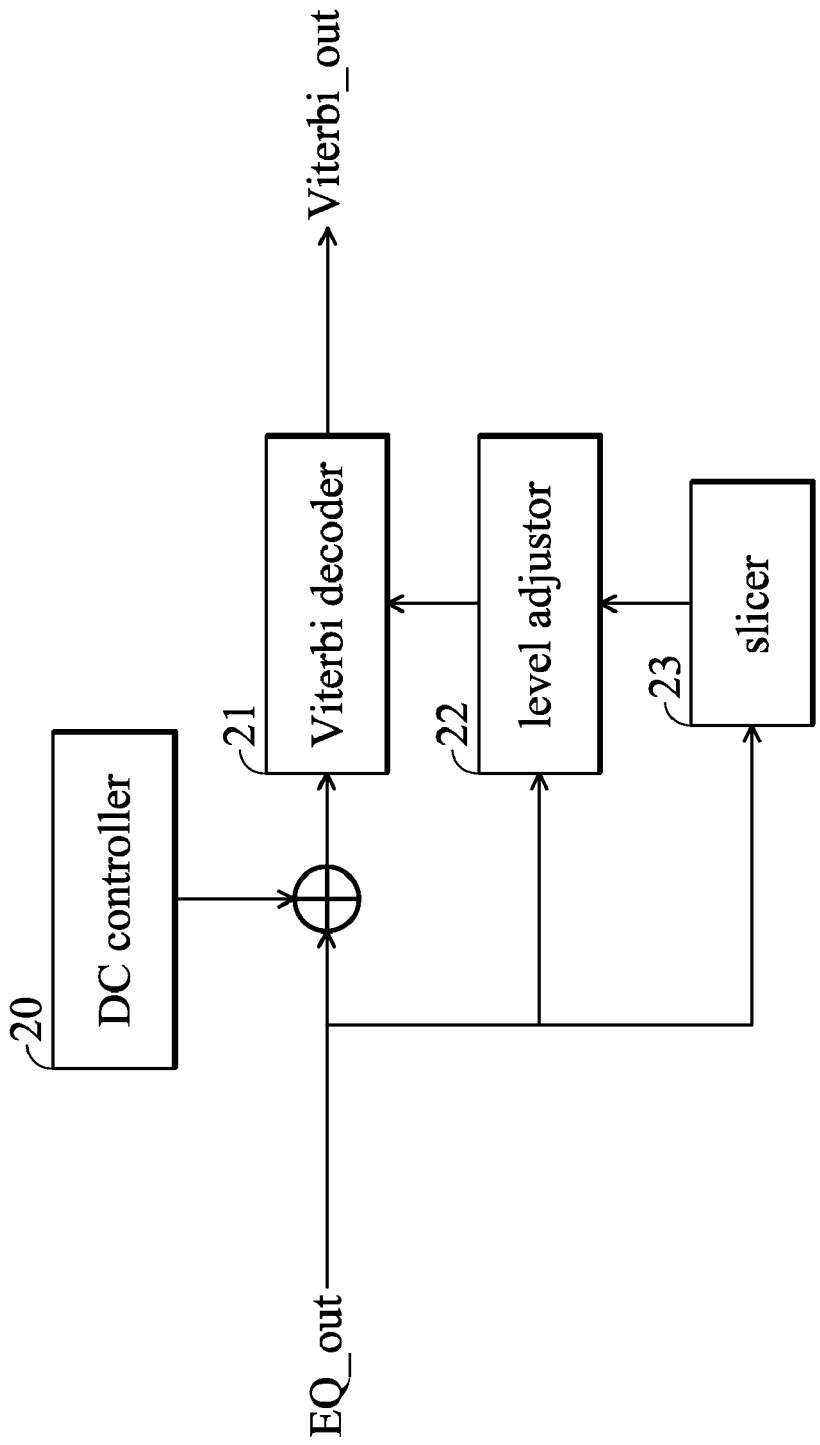
Figures 2, 2B:
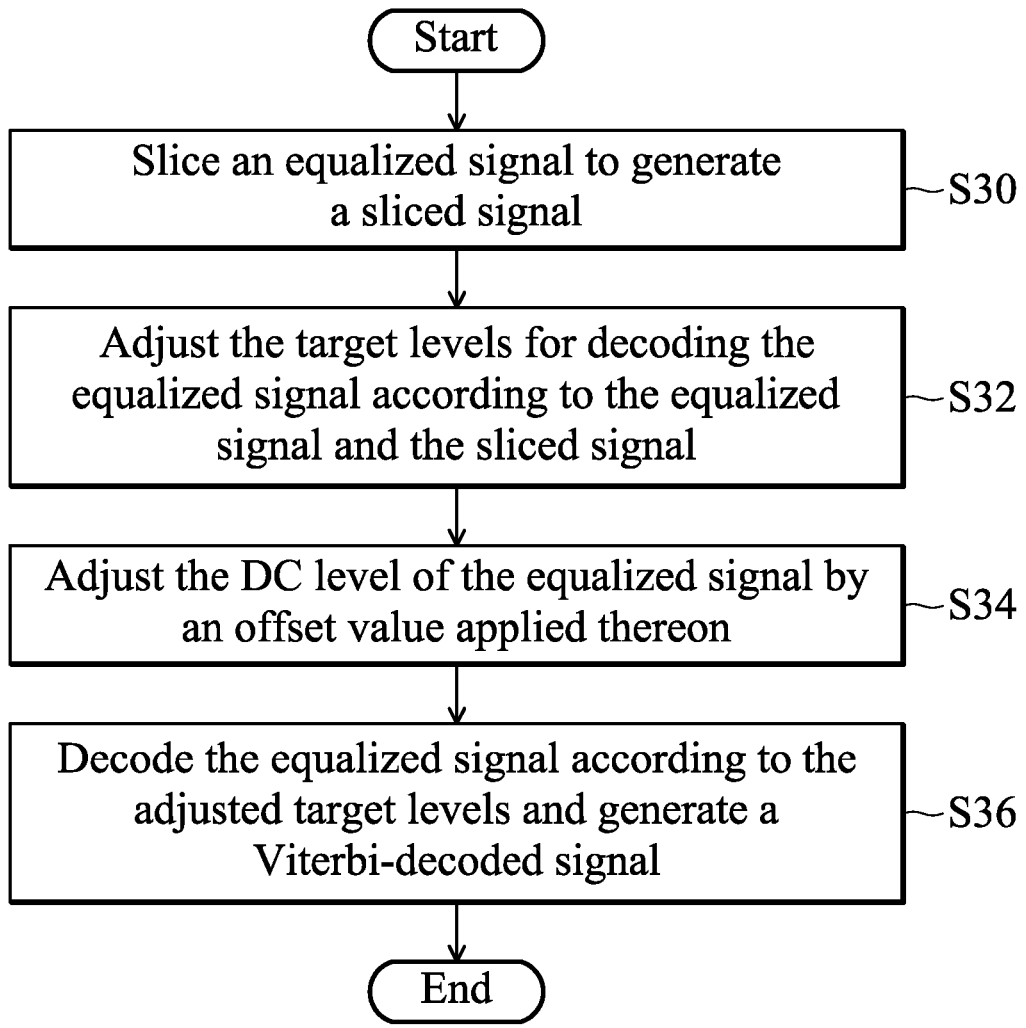

FIG. 2B-1 depicts a diagram of a Viterbi decoding apparatus according to an embodiment of the invention. In this embodiment, the equalized signal EQ_out received by the decoding apparatus 200B has a predetermined direct current (DC) level, and the DC controller 20 is coupled to the input of the Viterbi decoder 21 in order to adjust the DC level of the equalized signal EQ_out. During the decoding phase, the DC controller 20 may adjust the DC level of the equalized signal EQ_out by applying an offset value thereon such that the Viterbi decode 21 would decode the equalized signal EQ_out according to the adjusted DC level. The offset value may be obtained by a table look-up method, or may be given by a user through a user interface. FIG. 2B-2 depicts a flowchart of a decoding method according to an embodiment of the invention, which is performed in accordance with the decoding apparatus in FIG. 2B-1. Note that the steps S30, S32 and S36 are similar to the steps S20, S22 and S26 shown in FIG. 2A-2, so they not described herein for brevity. However, different from FIG. 2A-2, the DC level of the equalized signal is adjusted by applying an offset value thereon such that the equalized signal with an adjusted DC level may be decoded (step S34). Note that the order of performing the steps described above is not limited to the order shown in FIG. 2B-2.

Figures 1, 3A:
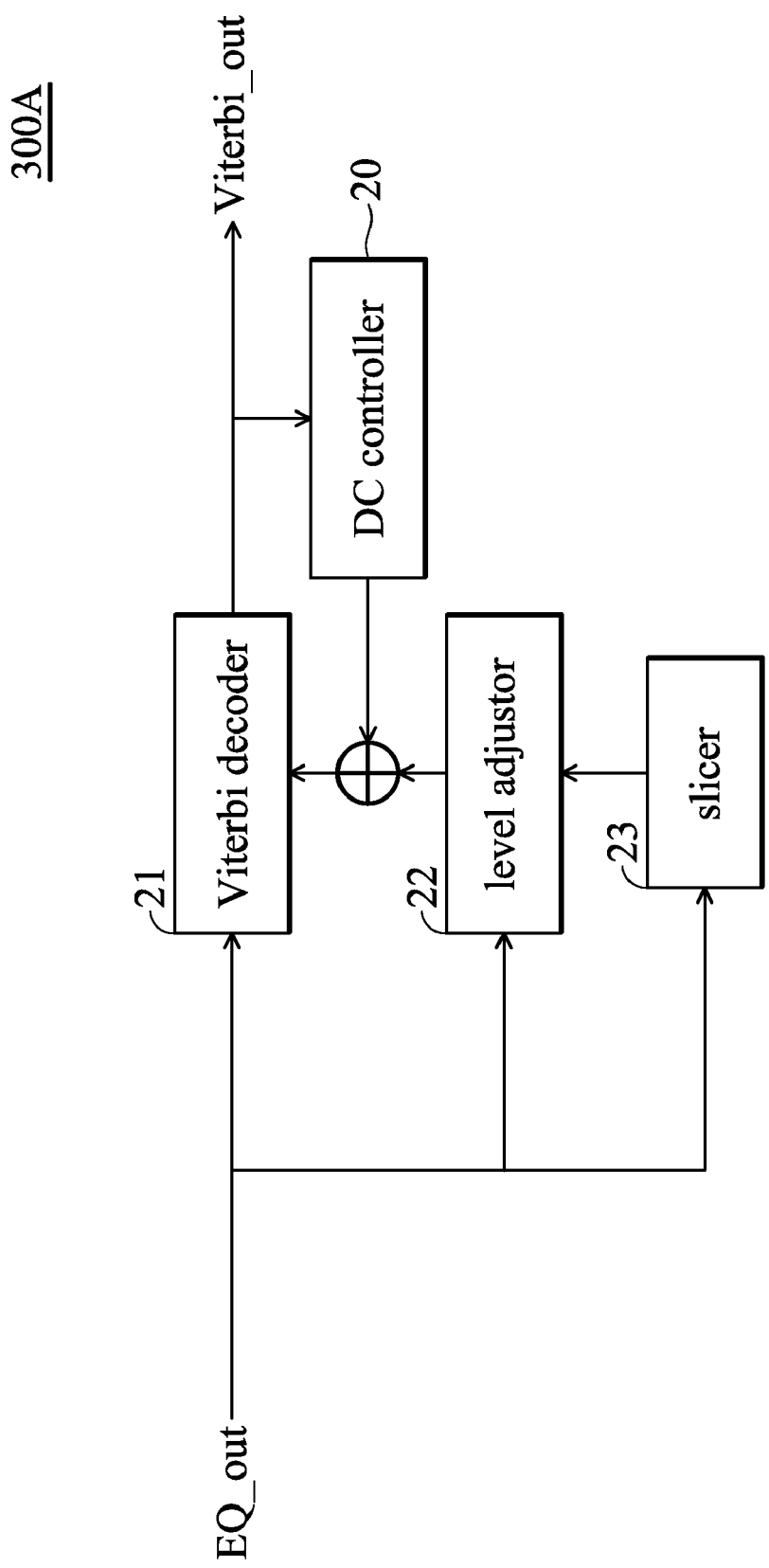
Figures 2, 3A:
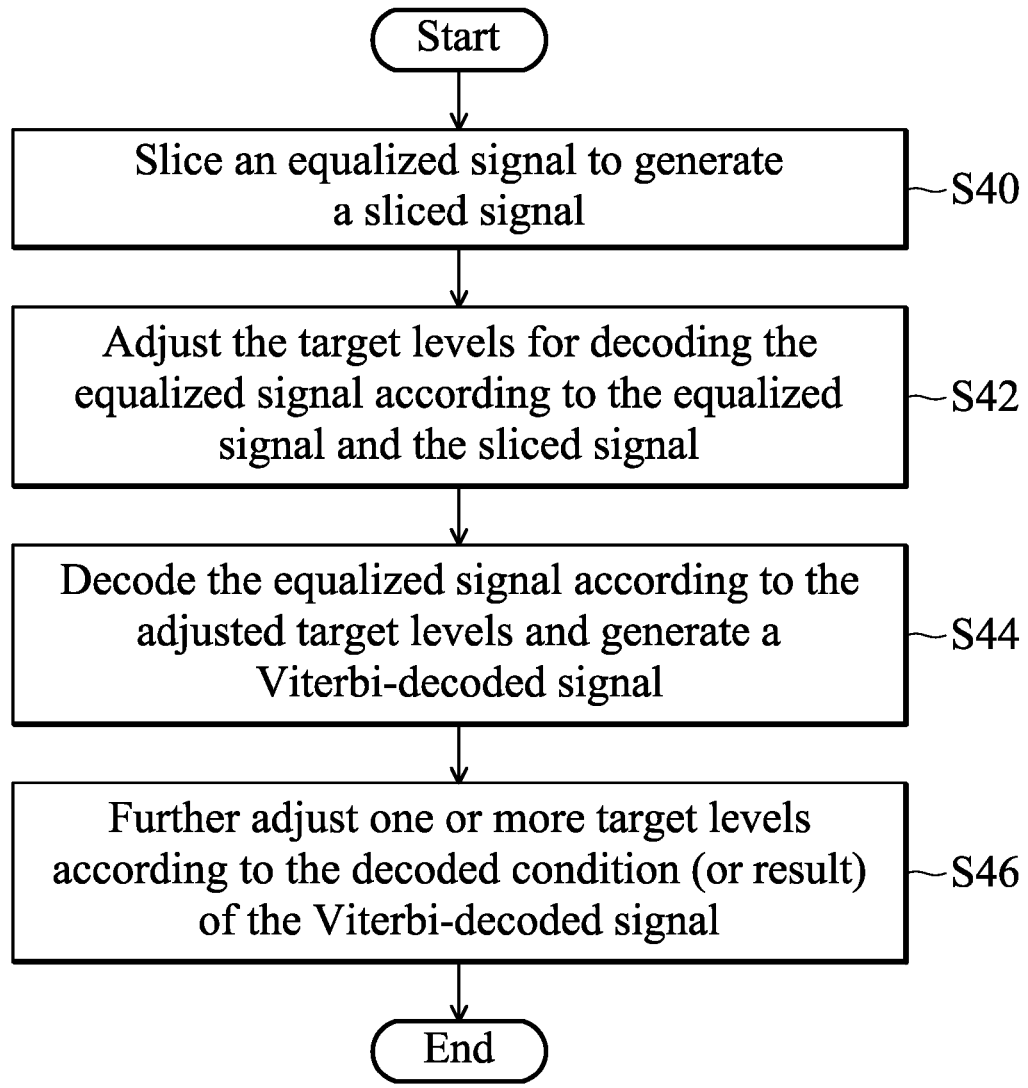

FIG. 3A-1 depicts a diagram of a Viterbi decoding apparatus according to an embodiment of the invention. Different from the embodiment of FIG. 2A-1, the DC controller 20 is further coupled to the output of the Viterbi decoder 21; that is, coupled to the Viterbi-decoded signal Viterbi_out. During the decoding phase, if the decoded condition (or result) of the Viterbi-decoded signal Viterbi_out is not good, the DC controller 20 may adjust one or more target levels for the Viterbi decoder 21 by applying an offset value thereon such that the Viterbi decoder 21 would decode the equalized signal EQ_out according to the adjusted target level(s). Thus, the Viterbi-decoded signal Viterbi_out can be more accurate due to the one or more properly adjusted target levels. An example of an undesired decoded condition (or result) of the Viterbi-decoded signal Viterbi_out may be represented by a digital sum value (DSV) thereof. Here the DSV means the difference between the total number of high segments and the total number of low segments of the signal. The larger the DSV is the more inaccurate the decoded condition (or result) is. That is, if the DSV of the Viterbi-decoded signal Viterbi_out is larger than a threshold value, the decoding of the Viterbi-decoded signal Viterbi_out is considered inaccurate. FIG. 3A-2 depicts a flowchart of a decoding method according to an embodiment of the invention, which is performed in accordance with the decoding apparatus in FIG. 3A-1. Note that steps S40, S42 and S44 are similar to steps S20, S22 and S26 shown in FIG. 2A-2, they are not described herein for brevity. In this embodiment, one or more target levels can be further adjusted according to the decoded condition (or result) of the Viterbi-decoded signal Viterbi_out (step S46). That is, if the decoded condition (or result) of the Viterbi-decoded signal Viterbi_out is not good, one or more target levels can be further adjusted by applying an offset value thereon such that the equalized signal can be decoded according to the further-adjusted target level(s). Note that the order of performing the steps described above is not limited to the order shown in FIG. 3A-2.

Figures 1, 3B:
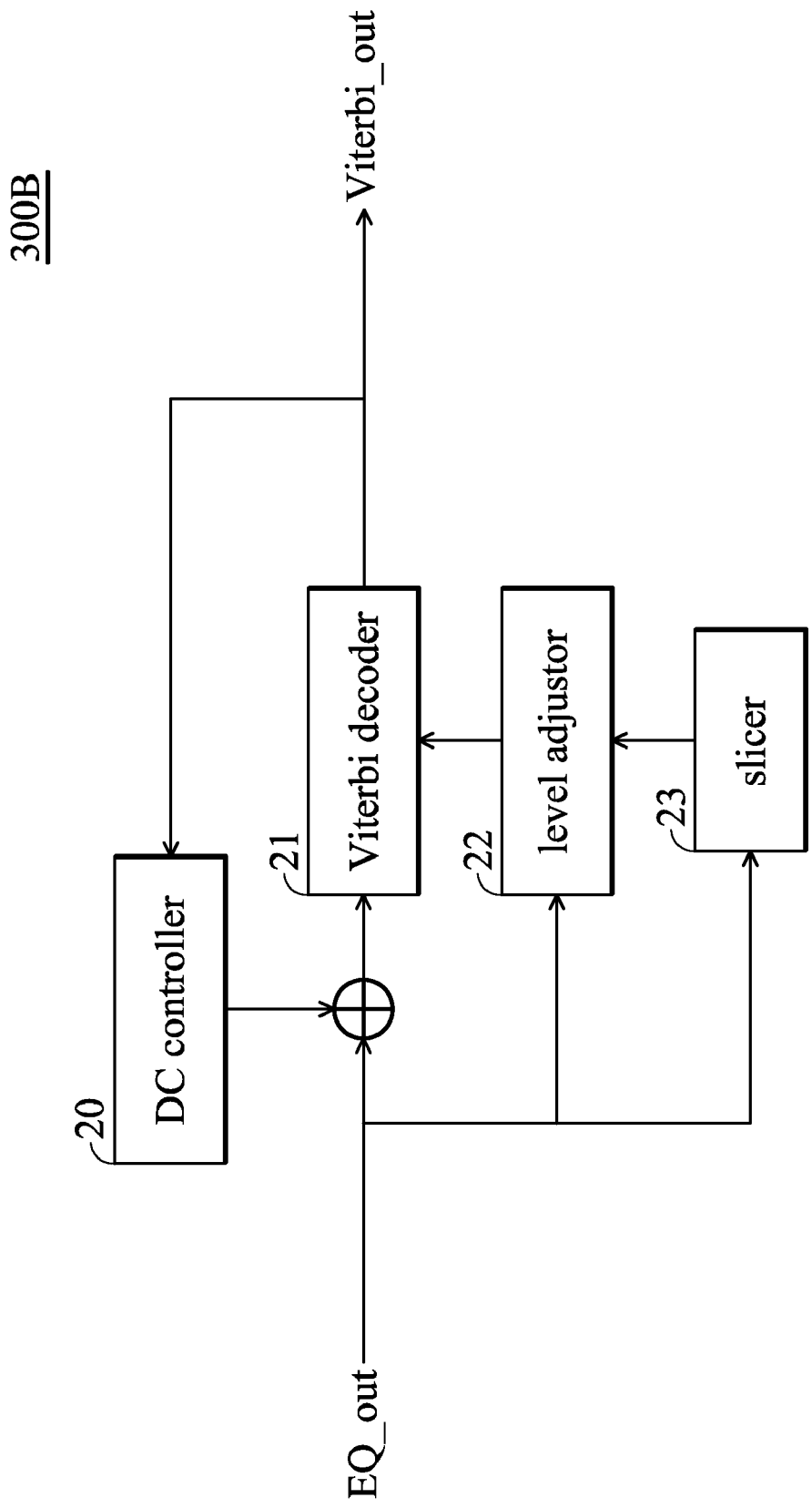
Figures 2, 3B:
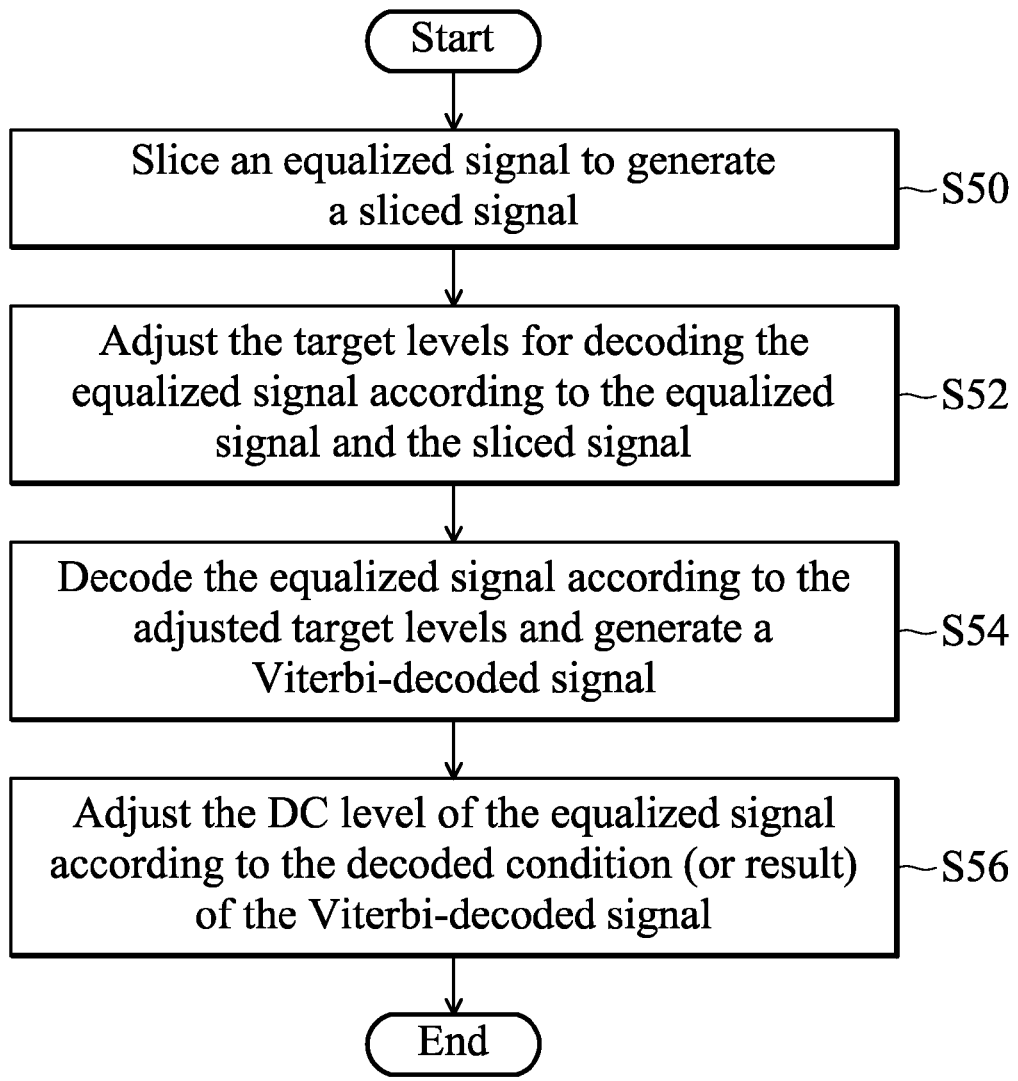

FIG. 3B-1 depicts a diagram of a Viterbi decoding apparatus according to an embodiment of the invention. Different from the embodiment of FIG. 2B-1, the DC controller 20 is coupled between the input and the output of the Viterbi decoder 21 in order to adjust the DC level of the equalized signal EQ_out according to the decoded condition (or result) of the Viterbi-decoded signal Viterbi_out. During the decoding phase, if the decoded condition (or result) of the Viterbi-decoded signal Viterbi_out is not good, the DC controller 20 may adjust the DC level of the equalized signal EQ_out by applying an offset value thereon such that the Viterbi decoder 21 would decode the equalized signal EQ_out according to the adjusted DC level. FIG. 3B-2 depicts a flowchart of a decoding method according to an embodiment of the invention, which is performed in accordance with the decoding apparatus in FIG. 3B-1. Note that steps S50, S52 and S54 are similar to the steps S30, S32 and S36 shown in FIG. 2B-2, so they are not described herein for brevity. In this embodiment, the DC level of the equalized signal is adjusted according to the decoded condition (or result) of the Viterbi-decoded signal Viterbi_out (step S56). That is, if the decoded condition (or result) of the Viterbi-decoded signal Viterbi_out is not good, the DC level of the equalized signal can be adjusted by applying an offset value thereon such that the equalized signal with an adjusted DC level may be decoded. Note that the order of performing the steps described above is not limited to the order shown in FIG. 3B-2.

Figures 1, 4A:
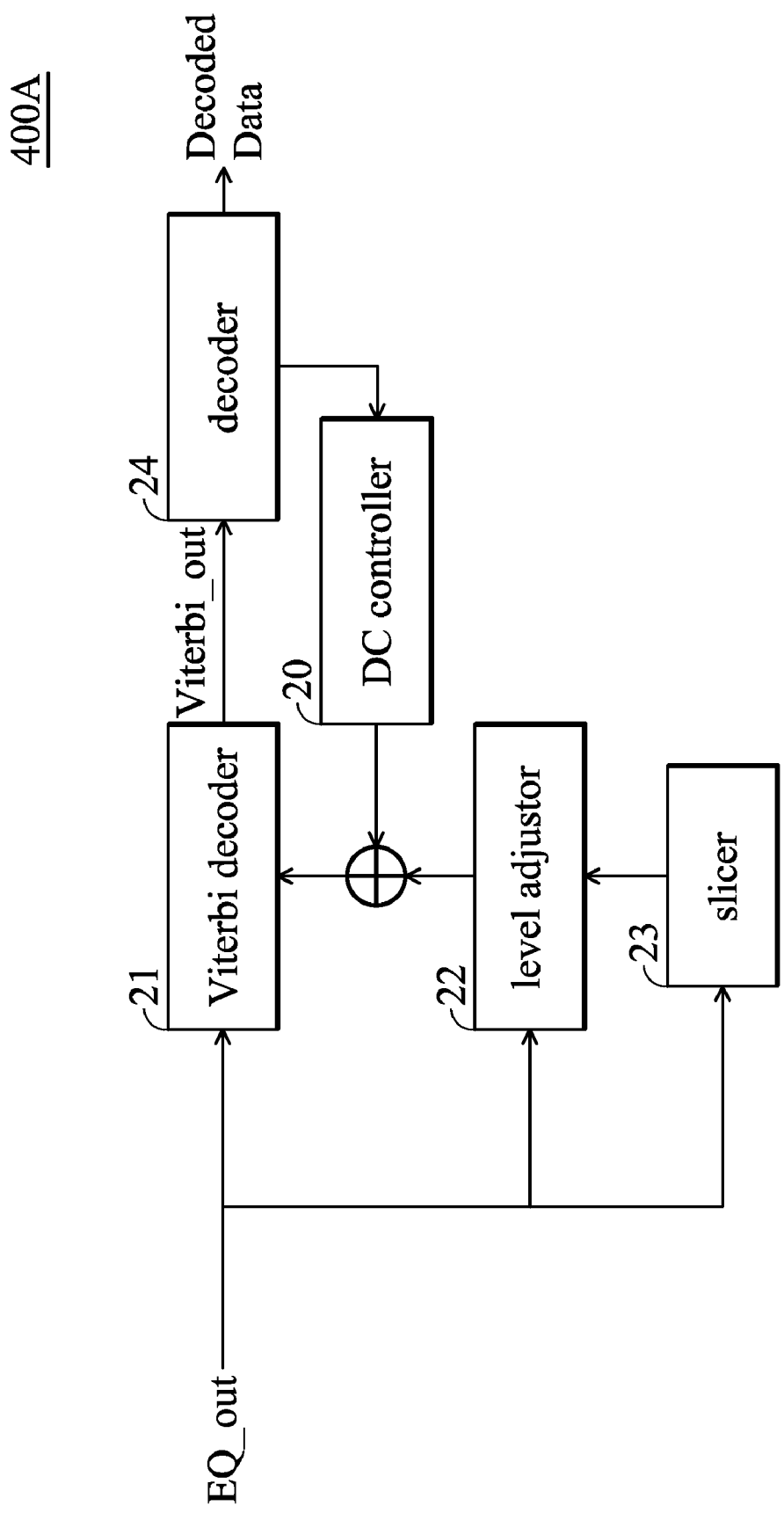
Figures 2, 4A:
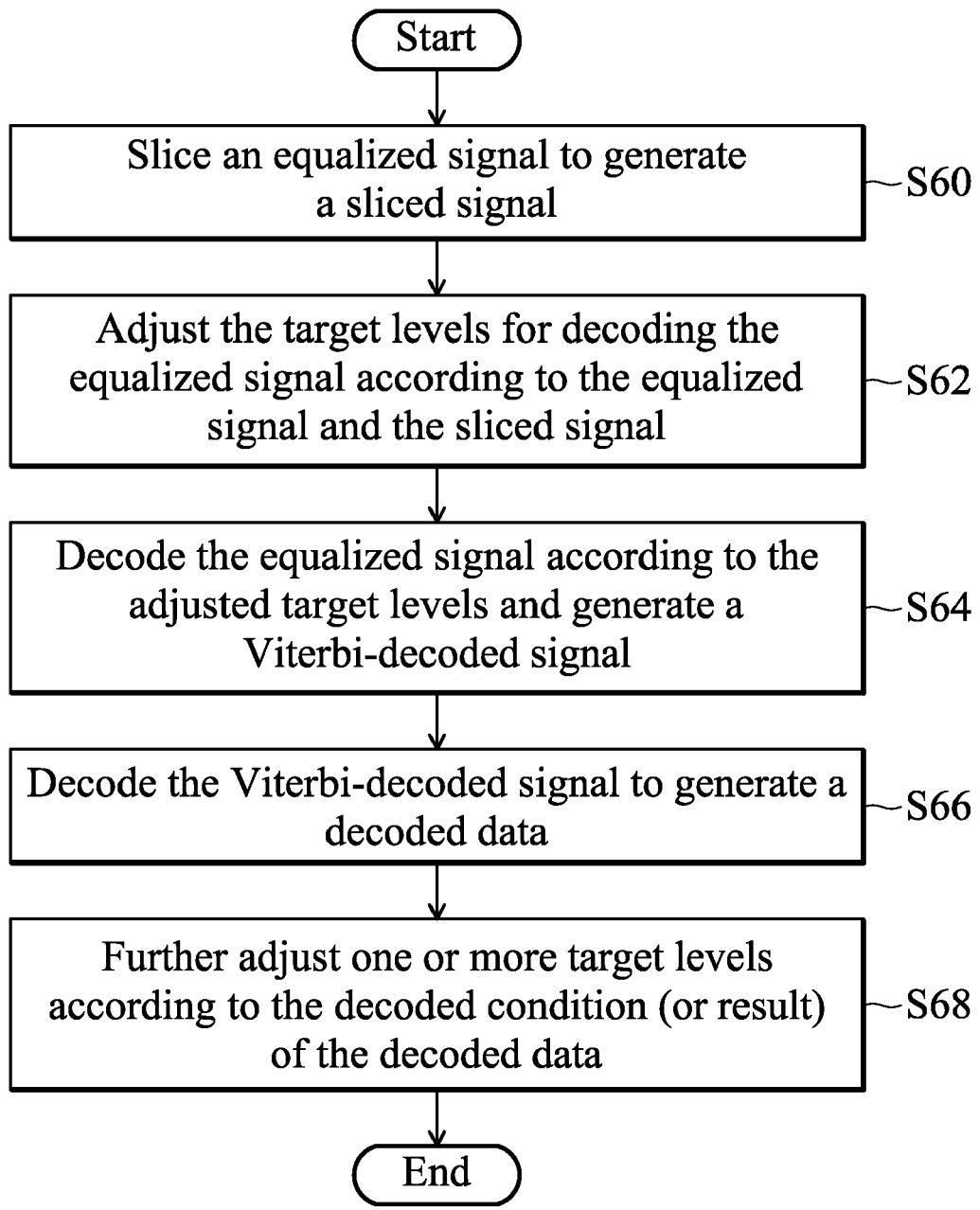

FIG. 4A-1 depicts a diagram of a Viterbi decoding apparatus according to an embodiment of the invention. Different from the embodiment of FIG. 2A-1, the DC controller 20 is further coupled to a decoder 24. The decoder 24 is configured to decode the Viterbi-decoded signal Viterbi_out and output the decoded data. During the decoding phase of the decoder 24, the decoder 24 outputs an indicator reflecting the decoded condition (or result) of the decoded data. If the decoded condition (or result) of the decoded data is not good, for example, the indicator can be set as logic high "1", informing the DC controller 20 to adjust one or more target levels for the Viterbi decoder 21. In response thereto, the DC controller 20 can adjust the one or more target levels by applying an offset value thereon such that the Viterbi decoder 21 decodes the equalized signal EQ_out according to the adjusted target level(s). The decoded data generated by the decoder 24 can be more accurate due to the one or more properly adjusted target levels. An example of an undesired decoded condition (or result) of the decoded data may be represented by an error rate thereof. In particular, if the error rate of the decoded data is higher than a threshold value, the decoder 24 may inform the DC controller 20 to adjust one or more target levels for the Viterbi decoder 21. FIG. 4A-2 depicts a flowchart of a decoding method according to an embodiment of the invention, which is performed in accordance with the decoding apparatus in FIG. 4A-1. Note that the steps S60 to S64 are similar to the steps S40 to S44 shown in FIG. 3A-2, so they are not described herein for brevity. In this embodiment, the Viterbi-decoded signal is decoded to generate a decoded data (step S66), and one or more target levels can be further adjusted according to the decoded condition (or result) of the decoded data (step S68). That is, if the decoded condition (or result) of the decoded data is not good, one or more target levels can be further adjusted by applying an offset value thereon such that the equalized signal can be decoded according to the further-adjusted target level(s). Note that the order of performing the steps described above is not limited to the order shown in FIG. 4A-2.

Figures 1, 4B:
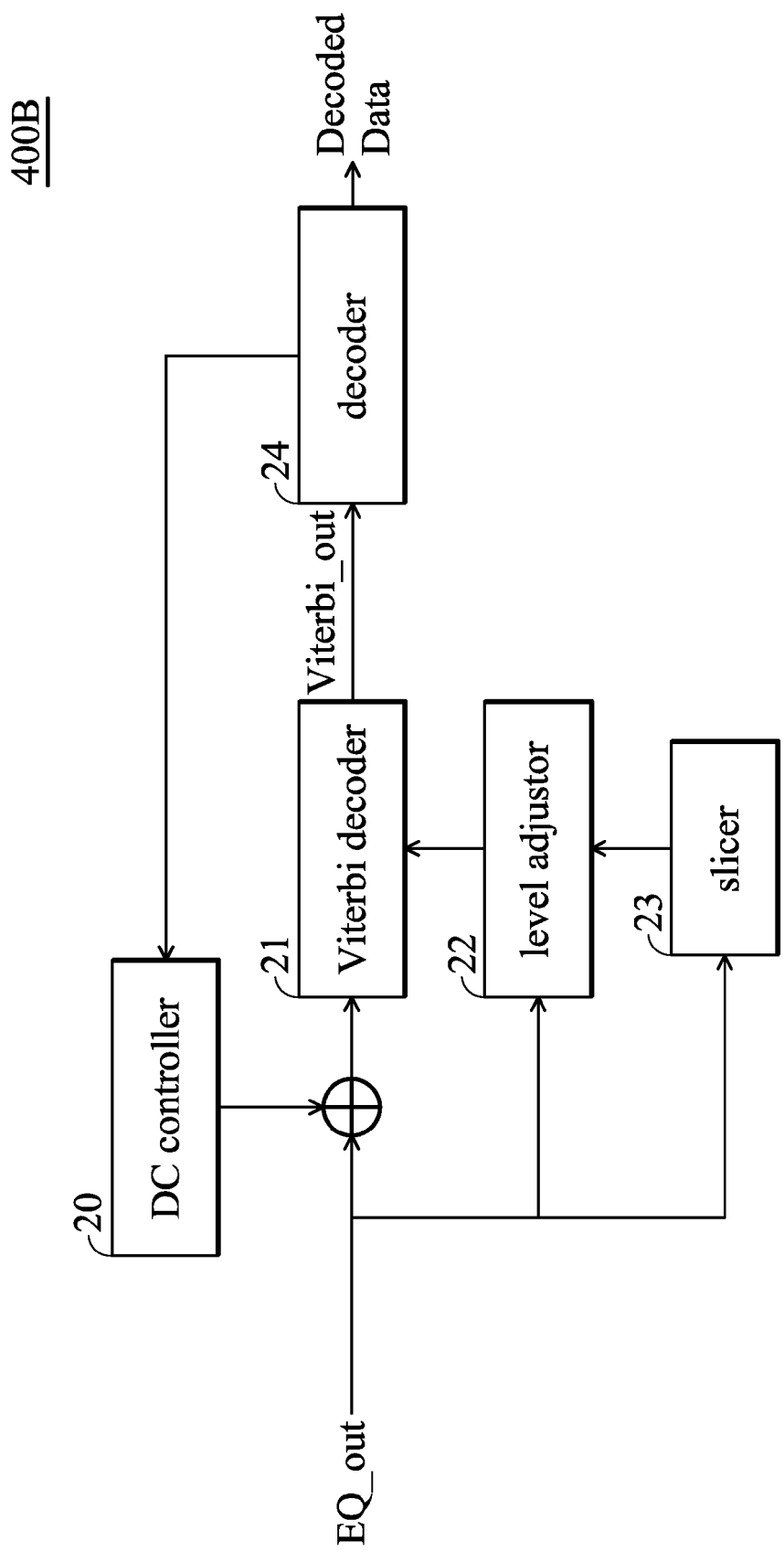
Figures 2, 4B:
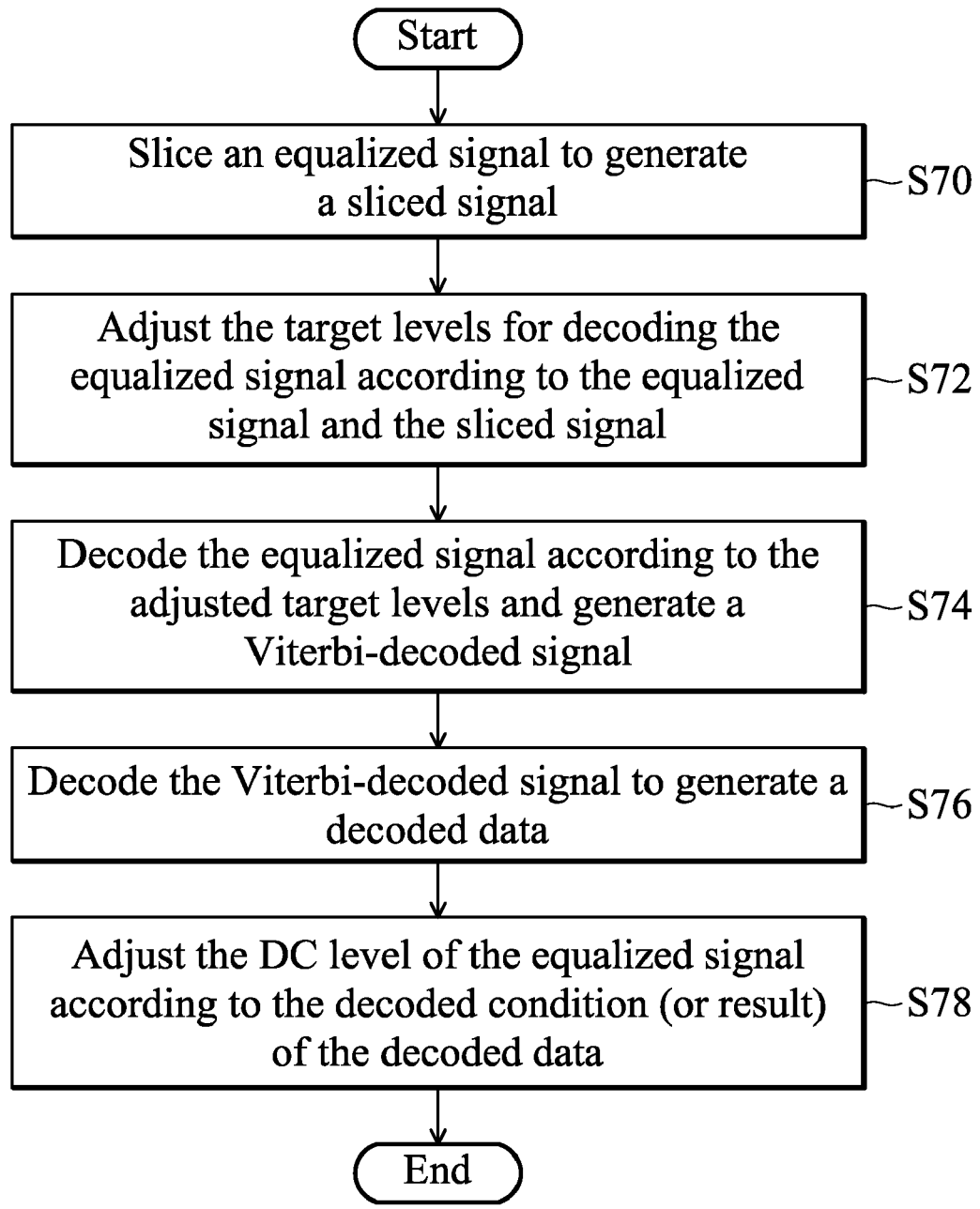

FIG. 4B-1 depicts a diagram of a Viterbi decoding apparatus according to an embodiment of the invention. Different from the embodiment of FIG. 2B-1, the DC controller 20 is further coupled to a decoder 24 in order to adjust the DC level of the equalized signal EQ_out according to the decoded condition (or result) of the decoded data generated by the decoder 24. During the decoding phase, the decoder 24 outputs an indicator reflecting the decoded condition (or result) of the decoded data. If the decoded condition (or result) of the decoded data is not good, for example, the indicator can be set as logic high "1", informing the DC controller 20 to adjust the DC level of the equalized signal EQ_out. In response thereto, the DC controller 20 adjusts the DC level of the equalized signal EQ_out by applying an offset value thereon such that the Viterbi decoder 21 decodes the equalized signal EQ_out according to the adjusted DC level. FIG. 4B-2 depicts a flowchart of a decoding method according to an embodiment of the invention, which is performed in accordance with the decoding apparatus in FIG. 4B-1. Note that steps S70 to S74 are similar to those shown in FIG. 3B-2, so they are not described herein for brevity. In this embodiment, the Viterbi-decoded signal is decoded to generate a decoded data (step S76), and the DC level of the equalized signal is adjusted according to the decoded condition (or result) of the decoded data (step S78). That is, if the decoded condition (or result) of the decoded data is not good, the DC level of the equalized signal can be adjusted by applying an offset value thereon such that the equalized signal with an adjusted DC level may be decoded. Note that the order of performing the steps described above is not limited to the order shown in FIG. 4B-2.

Figures 1, 5A:
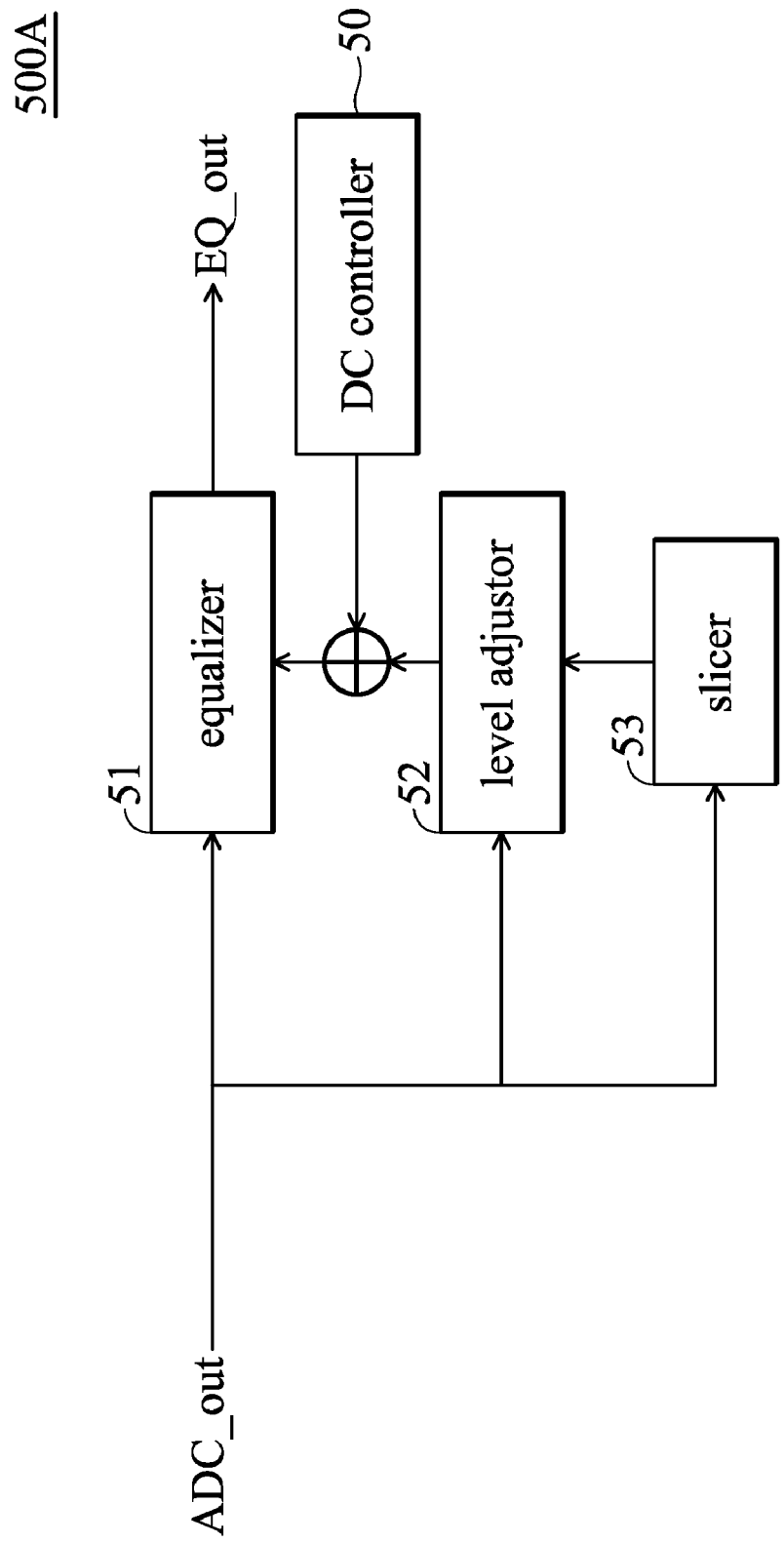
Figures 2, 5A:
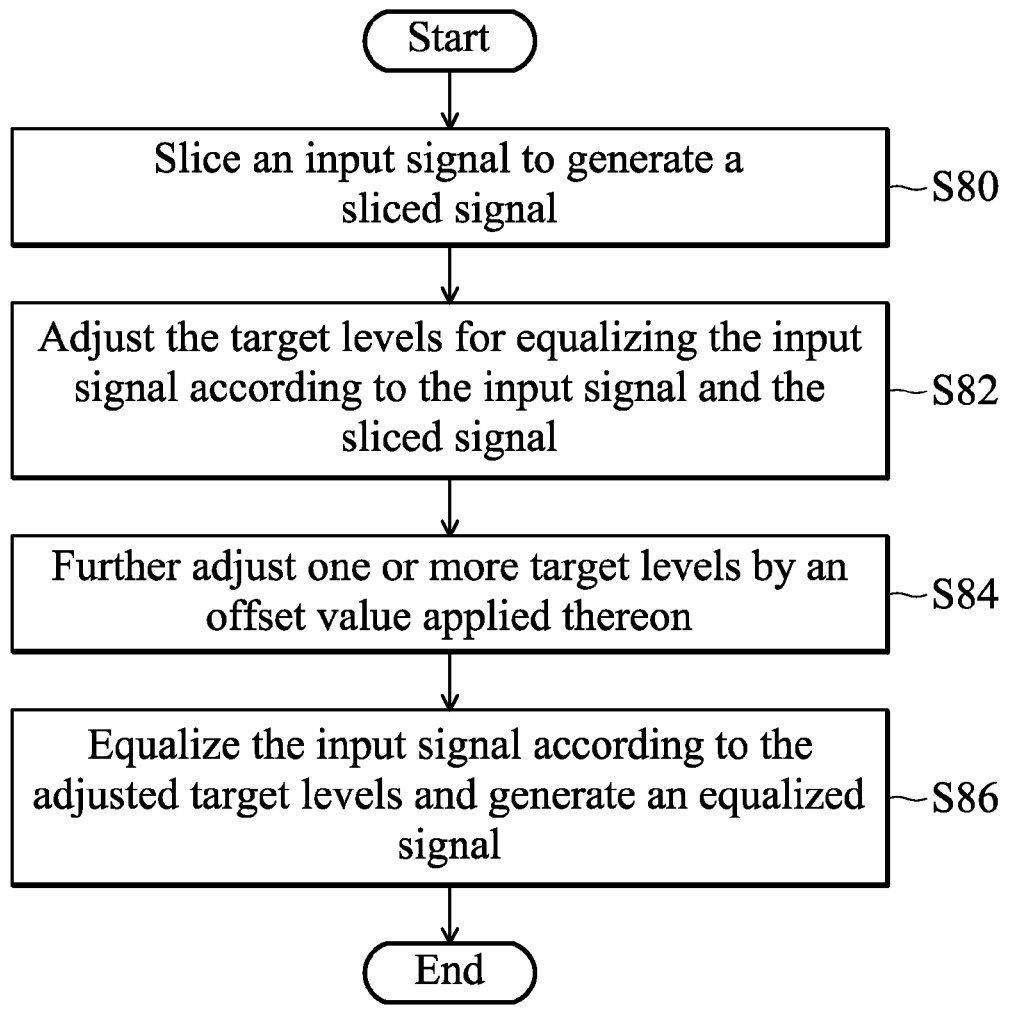
Figures 1, 5B:
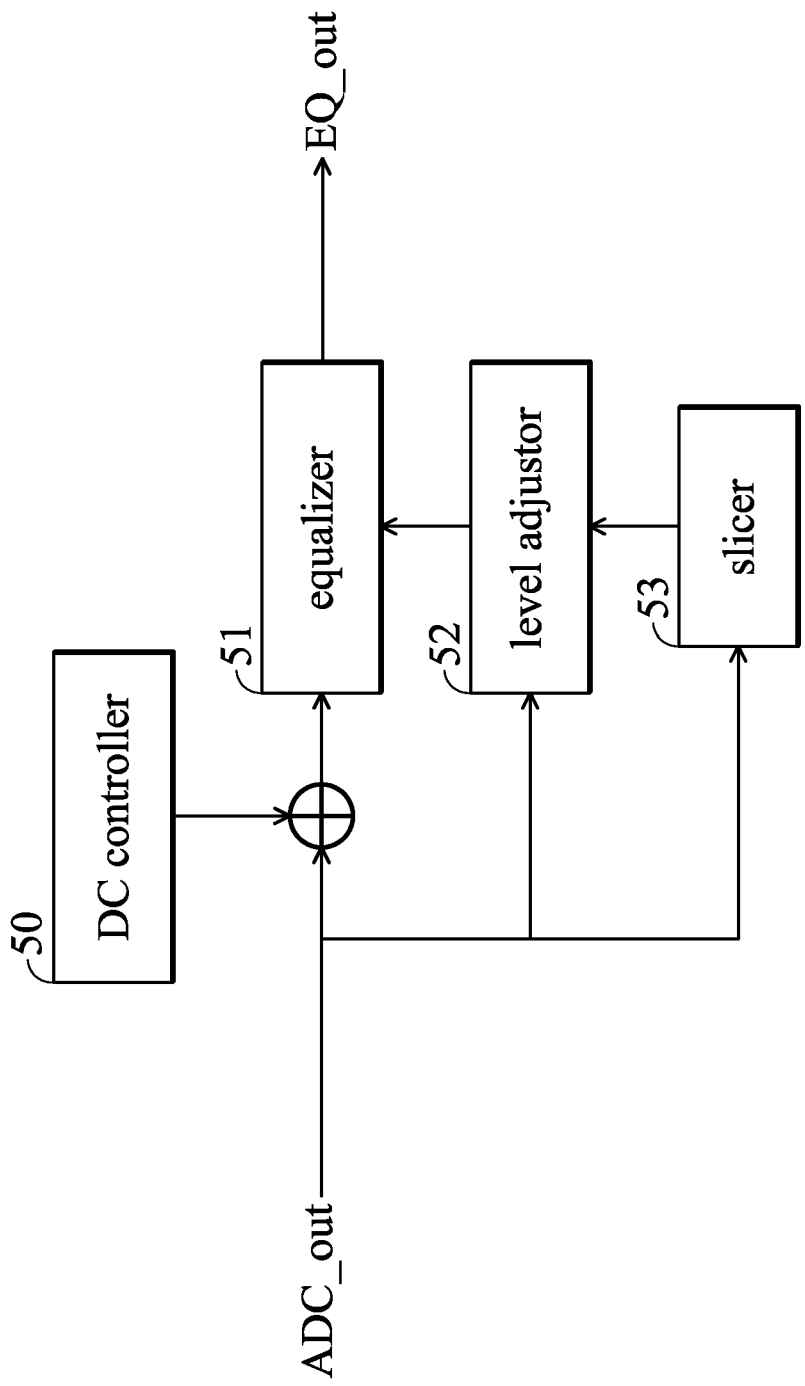
Figures 2, 5B:
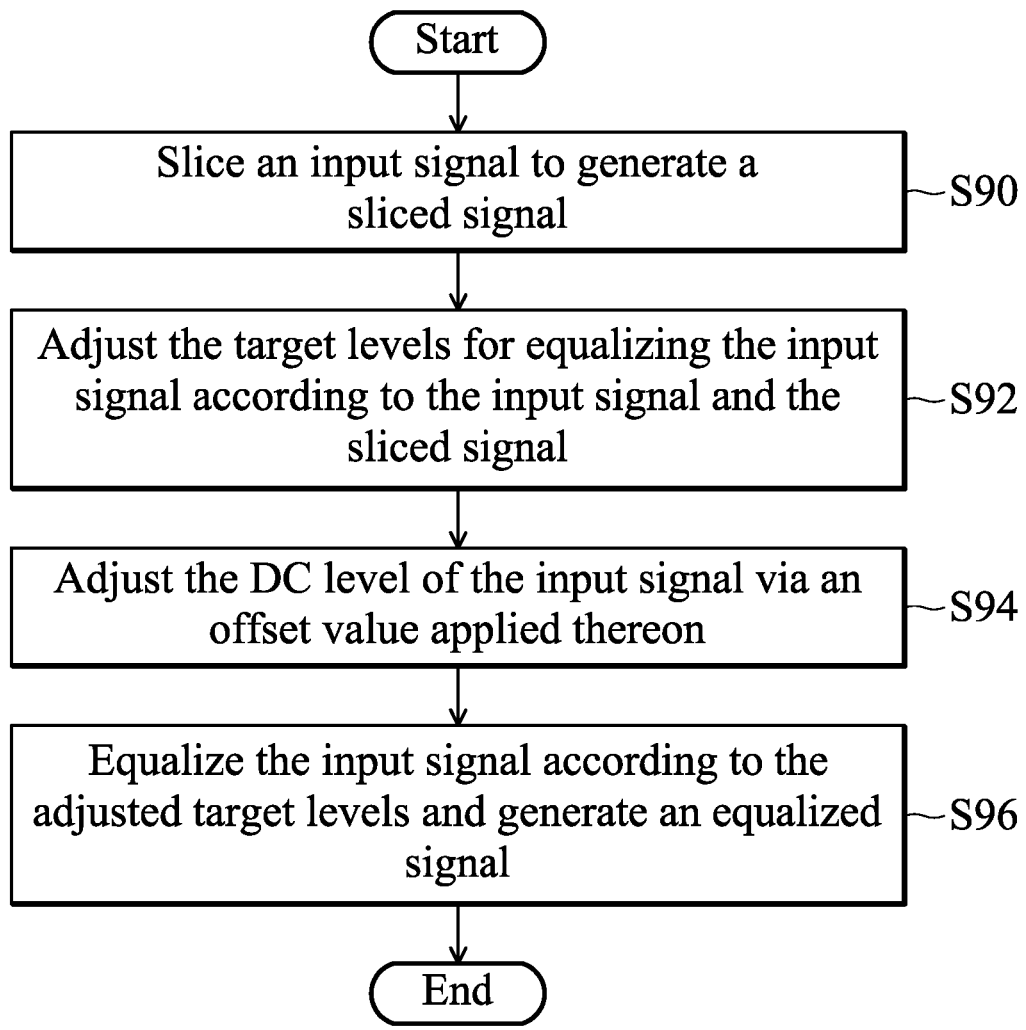
Figures 1, 6A:
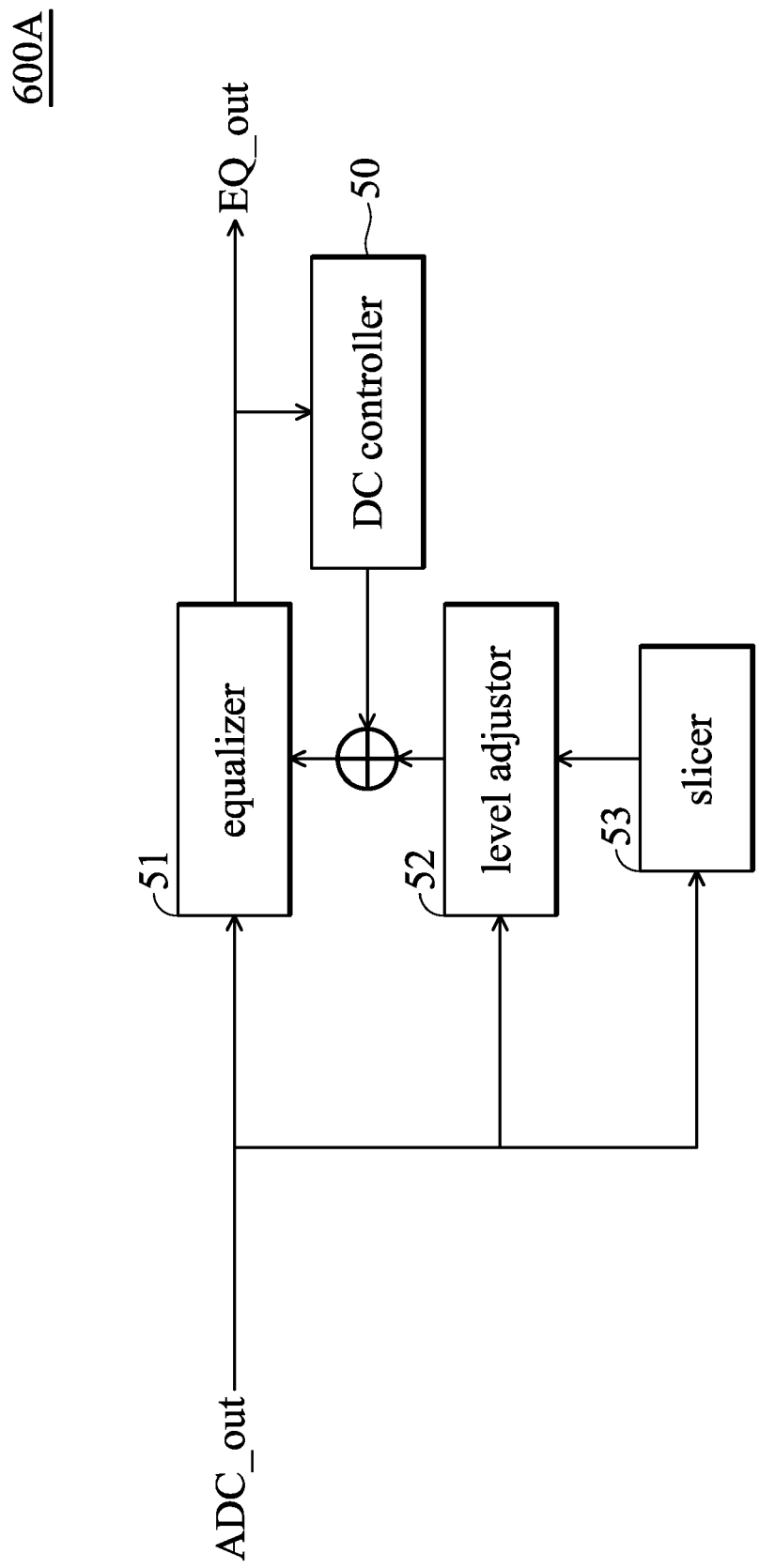
Figures 2, 6A:
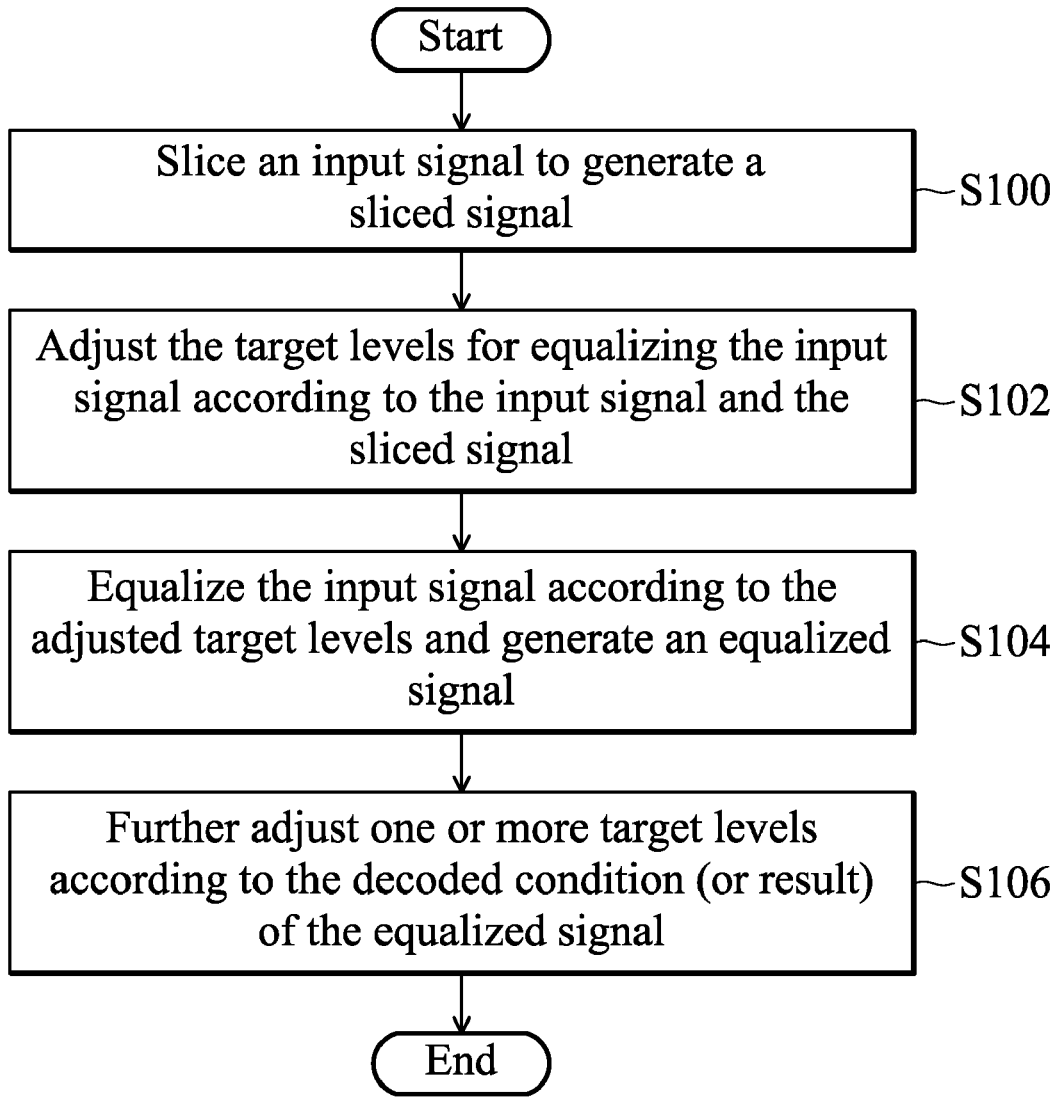
Figures 1, 6B:
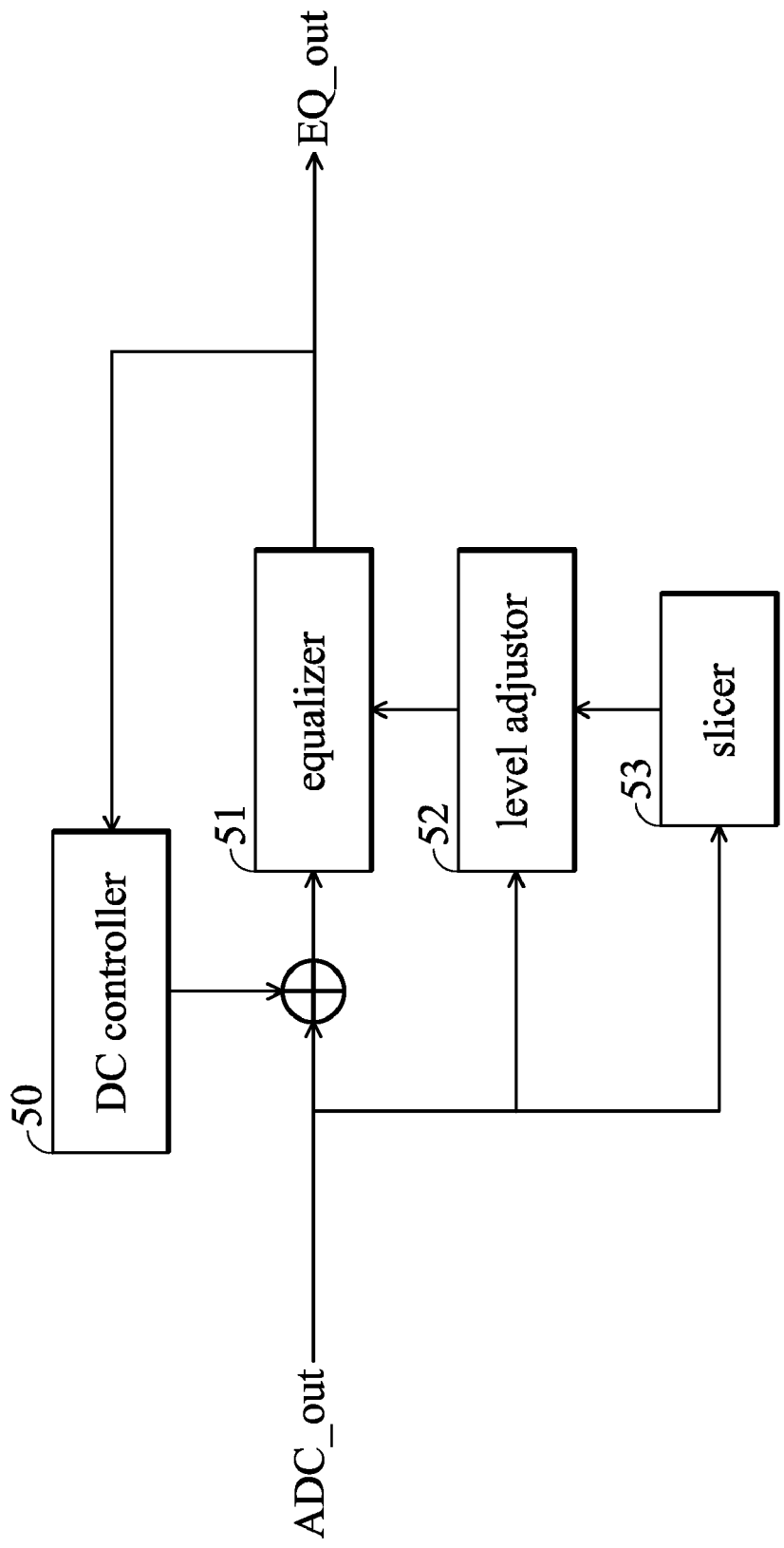
Figures 2, 6B:
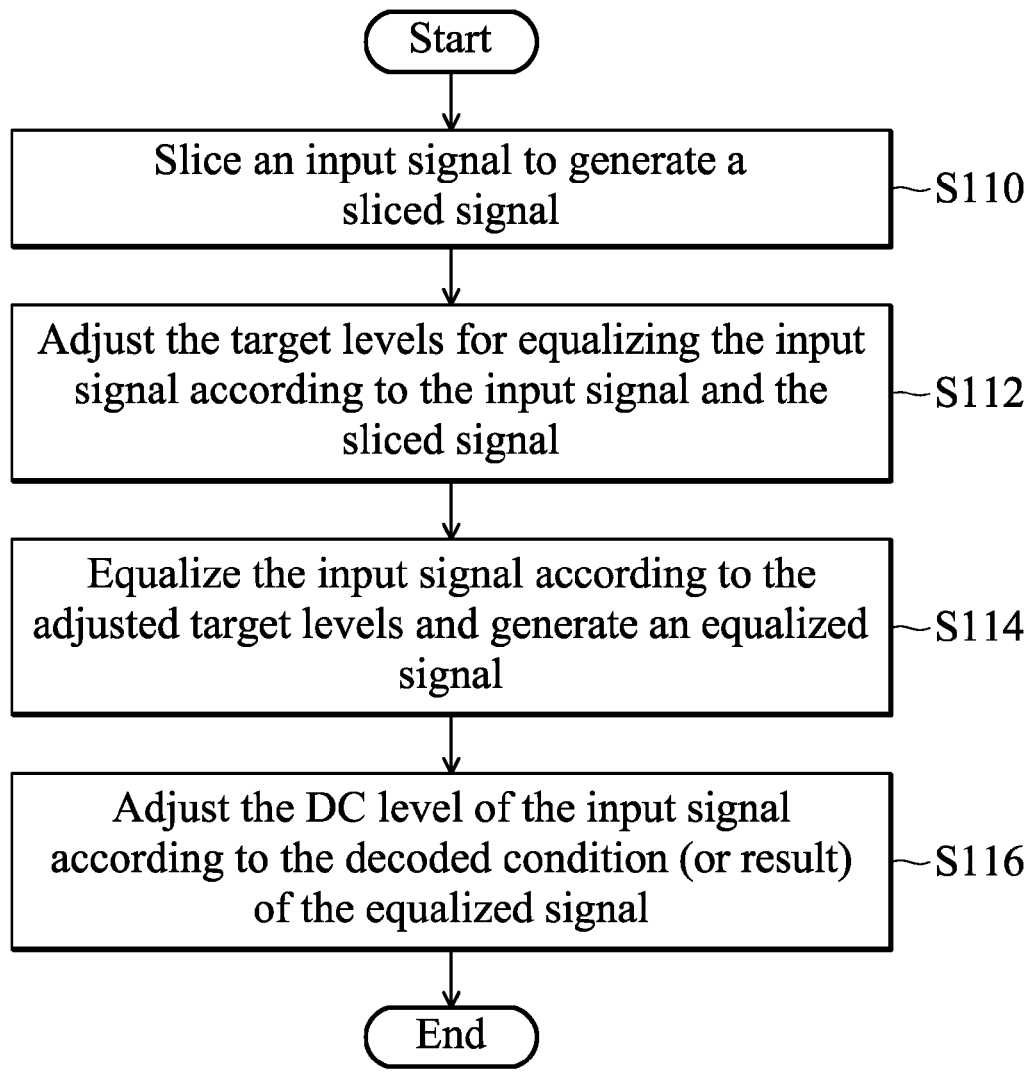

In addition, the Viterbi decoder 21 in FIGS. 2A-1 may be replaced by an equalizer 51, as shown in the corresponding FIGS. 5A-1. In this embodiment, the received input signal may be provided as a signal ADC_out output from an ADC, such as the ADC 4 in FIG. 1. The signal ADC_out may be generated by converting a radio frequency (RF) signal reproduced from an optical disk. In another embodiment, the received input signal can be output by another equalizer configured to equalize a radio frequency (RF) signal reproduced from an optical disk. The slicer 53 slices the signal ADC_out to generate a sliced signal. The level adjustor 52 adjusts the target levels for the equalizer 51 according to the signal ADC_out and the sliced signal. The equalizer 51 equalizes the signal ADC_out according to the adjusted target level(s) and outputs an equalized signal EQ_out. The operation of the DC controller 50 is similar to the DC controller 20 previously described. Specifically, as shown in FIGS. 5A-1, the DC controller 50 can adjust one or more target levels for the equalizer 51 such that the equalizer 51 equalizes the signal ADC_out according to the adjusted target level(s). The flowchart corresponding to FIGS. 5A-1 is shown in FIGS. 5A-2. The order of performing the steps is not limited to the order shown in FIGS. 5A-2. In addition, the Viterbi decoder 21 in FIGS. 2B-1 may be replaced by an equalizer 51, as shown in the corresponding FIGS. 5B-1. In the embodiment shown in FIGS. 5B-1, similar to FIGS. 5A-1, the received input signal may be a signal ADC_out and may have a DC level. Thus, the DC controller 50 can adjust the DC level of the signal ADC_out such that the equalizer 51 equalizes the signal ADC_out according to the adjusted DC level. The flowchart corresponding to FIGS. 5B-1 is shown in FIGS. 5B-2. The order of performing the steps is not limited to the order shown in FIGS. 5B-2. Similar to FIGS. 3A-1, in FIGS. 6A-1, the DC controller 50 is coupled to the output of the equalizer 51; that is, coupled to the equalized signal EQ_out. During the decoding phase, if the decoded condition (or result) of the equalized signal EQ_out is not good, the DC controller 50 may adjust one or more target levels of the equalizer 51 by applying an offset value thereon such that the equalizer 51 equalizes the signal ADC_out according to the adjusted target level(s). The equalized signal EQ_out can be more accurate due to the one or more properly adjusted target levels. Similar to the embodiment shown in FIGS. 3A-1, an example of an undesired decoded condition (or result) of the equalized signal EQ_out may be represented by the DSV thereof. The flowchart corresponding to FIGS. 6A-1 is shown in FIGS. 6A-2. The order of performing the steps is not limited to the order shown in FIGS. 6A-2. Similar to FIGS. 3B-1, in FIGS. 6B-1, the DC controller 50 is coupled between the input and output of the equalizer 51. Thus the DC controller 50 is coupled to the equalized signal EQ_out. Similar to FIGS. 6A-1, the received input signal may be a signal ADC_out and may have a DC level. During the decoding phase, if the decoded condition (or result) of the equalized signal EQ_out is not good, the DC controller 50 may adjust the DC level of the signal ADC_out by applying an offset value thereon such that the equalizer 51 equalizes the signal ADC_out according to the adjusted DC level. The output equalized signal EQ_out can be more accurate due to proper adjustment of the DC level of the signal ADC_out. Similar to FIGS. 3B-1, an example of an undesired decoded condition (or result) of the equalized signal EQ_out may be represented by the DSV thereof. The flowchart corresponding to FIGS. 6B-1 is shown in FIGS. 6B-2. The order of performing the steps is not limited to the order shown in FIGS. 6B-2.

Figures 1, 7A:
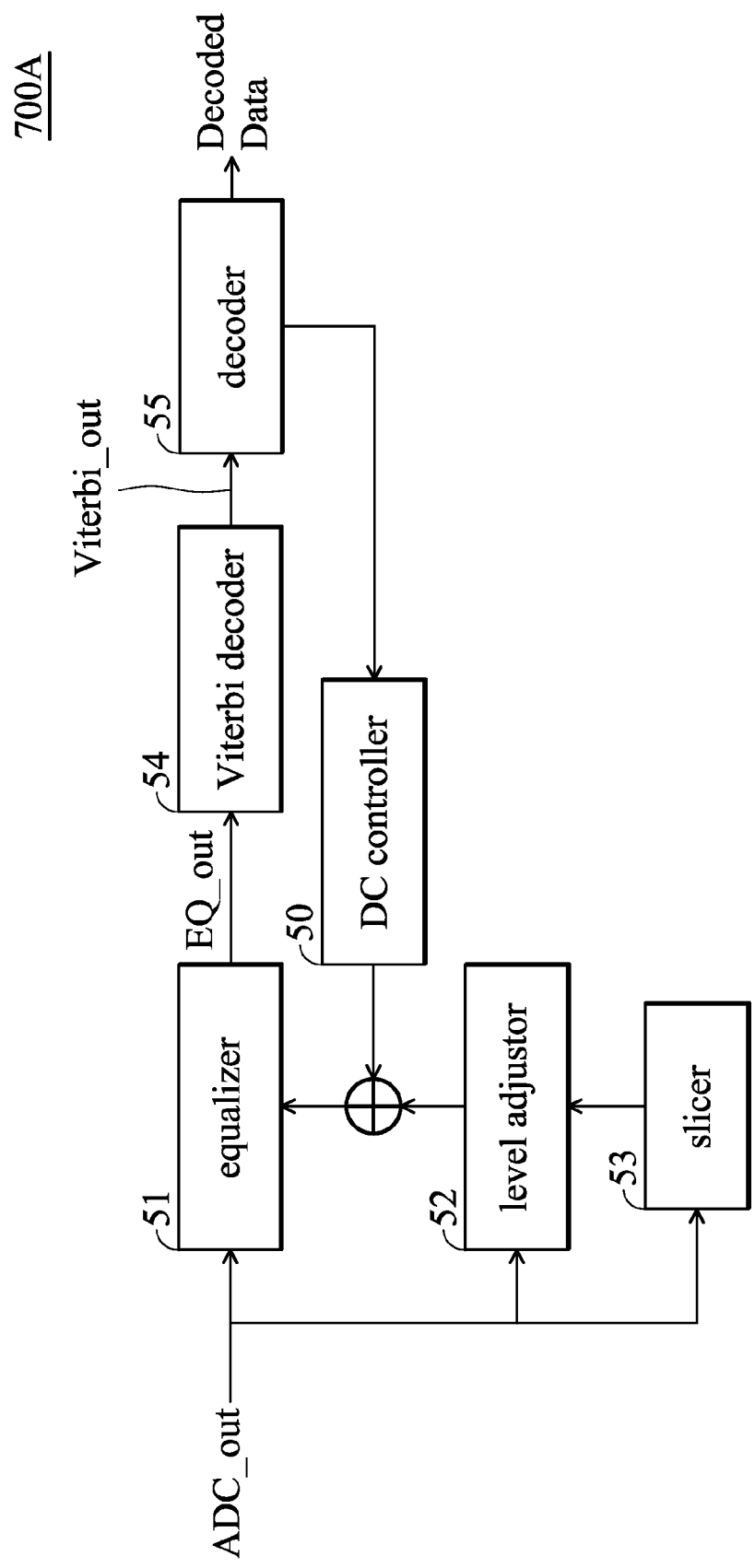
Figures 2, 7A:
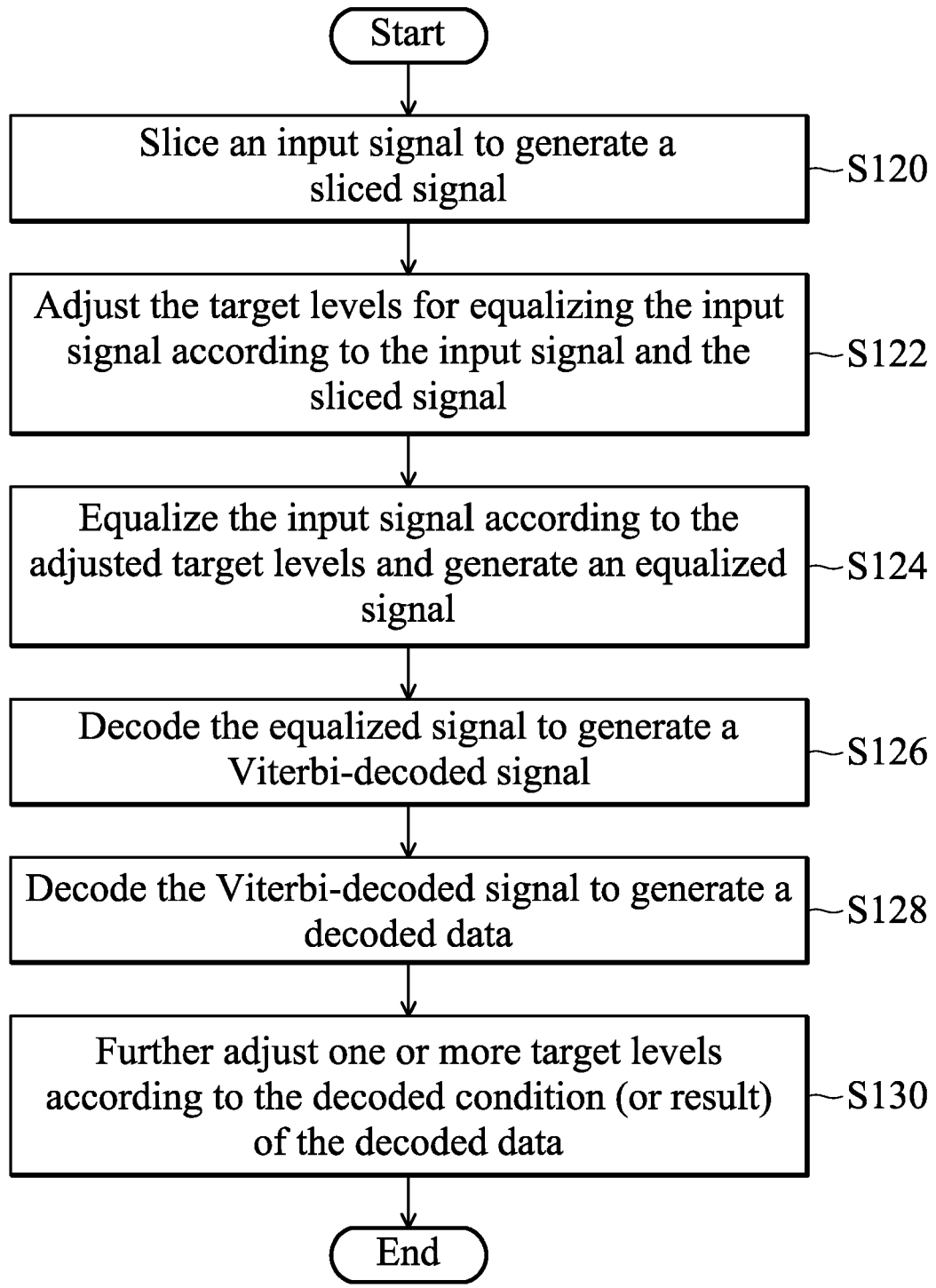

FIG. 7A-1 depicts a diagram of a decoding apparatus according to an embodiment of the invention. The decoding apparatus 700A comprises a DC controller 50, an equalizer 51, a level adjustor 52, a slicer 53, a Viterbi decoder 54 and a decoder 55. The input signal received by the decoding apparatus 700A may be the signal ADC_out as described above. In another embodiment, the received input signal can be output by another equalizer configured to equalize a radio frequency (RF) signal reproduced from an optical disk. The level adjustor 52 can adjust the target levels for the equalizer 51. The equalizer 51 equalizes the signal ADC_out according to the adjusted target levels and generates an equalized signal EQ_out. The Viterbi decoder 54 decodes the equalized signal EQ_out to generate a Viterbi-decoded signal Viterbi_out. The decoder 55 decodes the Viterbi-decoded signal Viterbi_out to generate a decoded data. In this embodiment, the DC controller 50 is coupled to the decoder 55. During the decoding phase of the decoder 55, the decoder 55 outputs an indicator reflecting the decoded condition (or result) of the decoded data. If the decoded condition (or result) of the decoded data is not good, the indicator can be set as logic high "1", informing the DC controller 50 to adjust one or more target levels for the equalizer 51. In response thereto, the DC controller 50 may adjust one or more target levels by applying an offset value thereon such that the equalizer 51 equalizes the signal ADC_out according to the adjusted target level(s). FIG. 7A-2 depicts a flowchart of a decoding method according to an embodiment of the invention, which is performed in accordance with the decoding apparatus in FIG. 7A-1. At the beginning, an input signal ADC_out is sliced to generate a sliced signal (step S120). Next, the target levels for equalizing the input signal ADC_out can be adjusted according to the input signal ADC_out and the sliced signal (step S122). Next, the input signal ADC_out can be equalized based on the adjusted target levels to generate an equalized signal EQ_out (step S124). Next, the equalized signal can be decoded to generate Viterbi-decoded signal Viterbi_out (S 126). Next, the Viterbi-decoded signal can be decoded to generate a decoded data (step S128). Next, one or more target levels can be adjusted according to the decoded condition (or result) of the decoded data (step S130). That is, one or more target levels are further adjusted by applying an offset value thereon such that the signal ADC_out can be equalized according to the further-adjusted target level(s). Besides, the order of performing the steps described above is not limited to the order shown in FIG. 7A-2.

Figures 1, 7B:
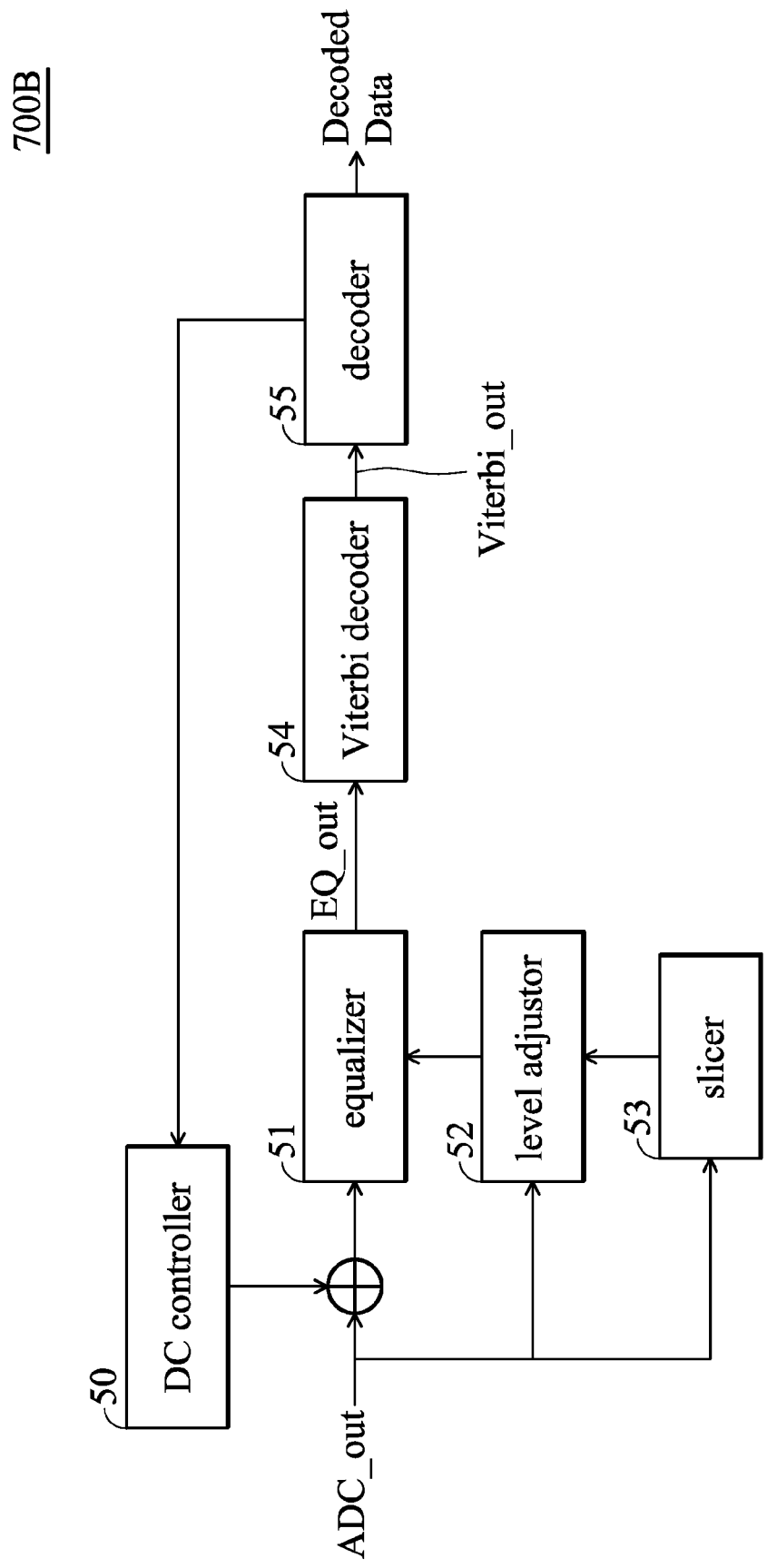
Figures 2, 7B:
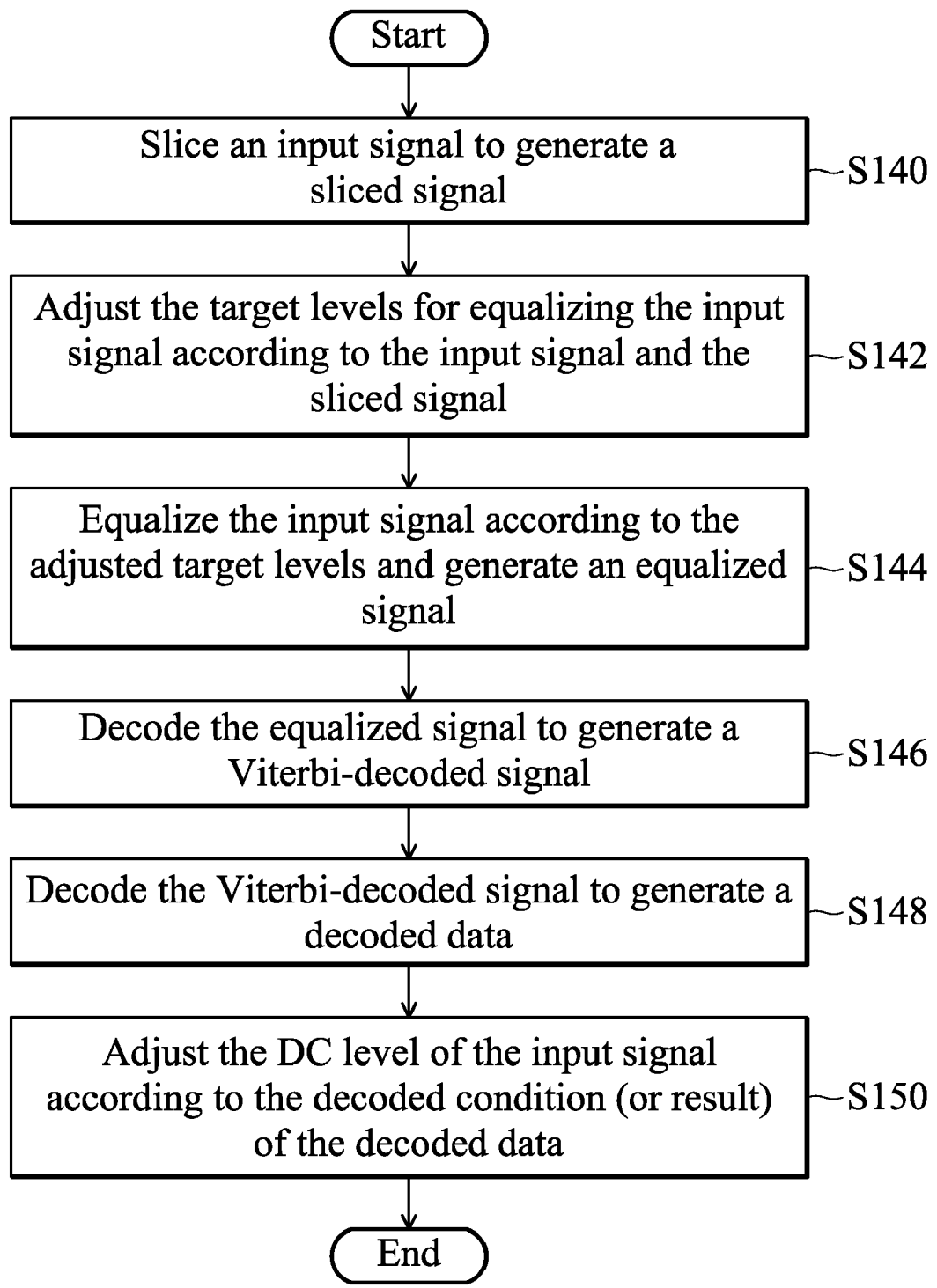

FIG. 7B-1 depicts a diagram of a decoding apparatus according to an embodiment of the invention. The input signal received by the decoding apparatus 700B may be the signal ADC_out and may have a DC level. In another embodiment, the received input signal can be output by another equalizer configured to equalize a radio frequency (RF) signal reproduced from an optical disk. The slicer 53, level adjustor 52, Viterbi decoder 54 and decoder 55 work in similar ways to those in FIG. 7A-1. The DC controller 50 is coupled to the decoder 55. During the decoding phase of the decoder 55, the decoder 55 outputs an indicator reflecting the decoded condition (or result) of the decoded data. If the decoded condition (or result) of the decoded data is not good, the indicator can be set as logic high "1", informing the DC controller 50 to adjust the DC level of the signal ADC_out. In response thereto, the DC controller 50 adjusts the DC level of the signal ADC_out by applying an offset value thereon such that the equalizer 51 equalizes the signal ADC_out according to the adjusted DC level. Note that the steps S140 to S148 are similar to the steps S120 to S128 shown in FIG. 7A-2, they are not described herein for brevity. Different from the steps of FIG. 7A-2, the DC level of the input signal can be adjusted by applying an offset value thereon such that the input signal with an adjusted DC level may be equalized (step S138). Besides, the order of performing the steps described above is not limited to the order shown in FIG. 7B-2.

Note that in the embodiments above, although it is stated that the level adjustor 22 and 52 adjust the target levels for the Viterbi decoder 21 and equalizer 51 according to the signal EQ_out and ADC_out respectively, the level adjustor 22 and 52 may also adjust the target levels for the Viterbi decoder 21 and the equalizer 51 based on the signals from earlier or later stages, such as the Viterbi-decoded signal Viterbi_out. Besides, though in the embodiments above, the DC level or target level are adjusted by apply an offset value thereon, the DC level or target level can be adjusted by any other ways such as apply a gain thereon.

Figure 8:
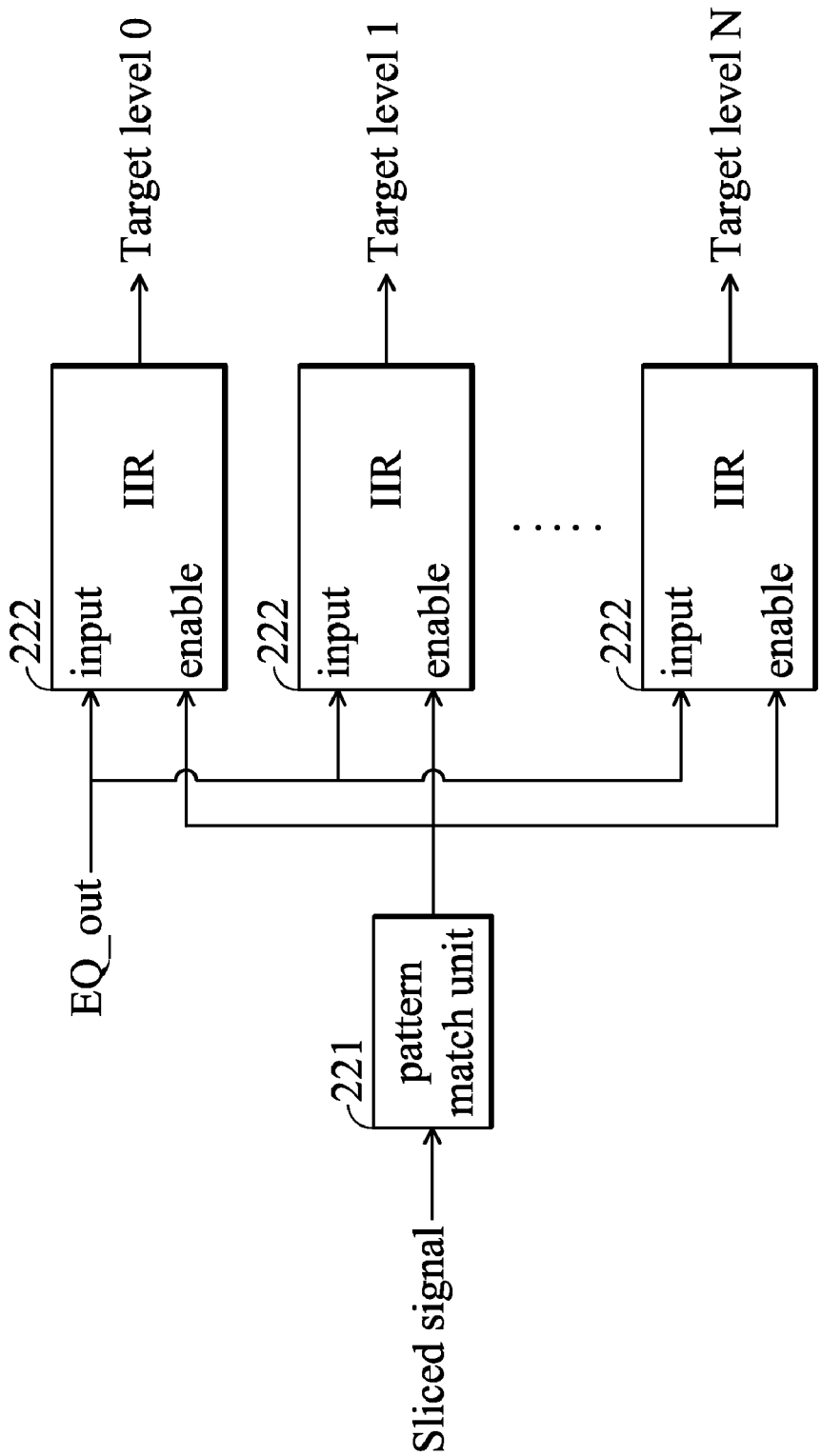
FIG. 8 depicts a detailed diagram of a level adjustor adjusting the target levels for a Viterbi decoder according to an embodiment of invention.

FIG. 8 depicts a detailed diagram of a level adjustor adjusting the target levels for a Viterbi decoder according to an embodiment of invention. Using the embodiment of FIG. 2A-1 as an example, the level adjustor 22 may comprise a pattern match unit 221 and a plurality of infinite impulse response (IIR) filters 222. The pattern match unit 221 receives the sliced signal and compares the sliced signal with a plurality of default patterns, each corresponding to an individual IIR filter 222. If the pattern of the sliced signal matches one of the default patterns of the IIR filters 222, the corresponding IIR filter 222 will be enabled and the equalized signal EQ_out is sampled by that IIR filter 222. Thus, a corresponding target level is output to the Viterbi decoder 21 for decoding.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for improving decoding accuracy of an equalized signal having a direct current (DC) level obtained from an optical disk, comprising:
 a Viterbi decoder configured to decode the equalized signal and output a Viterbi-decoded signal; and a DC controller configured to add an offset value to the equalized signal, to adjust the DC level of the equalized signal such that the equalized signal with the adjusted DC level is decoded.

2. The apparatus as claimed in claim 1, wherein the Viterbi decoder further decodes the equalized signal according to at least one target level, and the apparatus further comprises:

a level adjustor configured to adjust the at least one target level according to a sliced signal such that the equalized signal is decoded according to the adjusted target level.

3. The apparatus as claimed in claim 2, further comprising:

a slicer configured to generate the sliced signal by slicing the equalized signal.

4. The apparatus as claimed in claim 1, wherein the offset value is determined according to a table look-up method.

5. The apparatus as claimed in claim 1, wherein the DC controller adjusts the DC level of the equalized signal according to the Viterbi-decoded signal.

6. The apparatus as claimed in claim 5, wherein the DC controller adjusts the DC level of the equalized signal when a digital sum value (DSV) of the Viterbi-decoded signal is larger than a threshold value.

7. The apparatus as claimed in claim 1, further comprising:

a decoder configured to decode the Viterbi-decoded signal and output an indicator reflecting the decoded condition of the Viterbi-decoded signal, wherein the DC controller adjusts the DC level of the equalized signal according to the indicator.

8. The apparatus as claimed in claim 1, wherein the DC level of the equalized signal obtained from the optical disk is a predetermined DC level.

* * * * *